(12) United States Patent
Kumar et al.

(10) Patent No.: US 8,547,725 B2
(45) Date of Patent: Oct. 1, 2013

(54) METHOD OF PROGRAMMING A NONVOLATILE MEMORY CELL BY REVERSE BIASING A DIODE STEERING ELEMENT TO SET A STORAGE ELEMENT

(75) Inventors: Tanmay Kumar, Pleasanton, CA (US); Roy Scheuerlein, Cupertino, CA (US); Pankaj Kalra, Mountain View, CA (US); Jingyan Zhang, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 601 days.

(21) Appl. No.: 12/703,289

(22) Filed: Feb. 10, 2010

(65) Prior Publication Data

US 2010/0142256 A1 Jun. 10, 2010

Related U.S. Application Data

(63) Continuation-in-part of application No. 12/318,021, filed on Dec. 19, 2008, now Pat. No. 7,944,728, and a continuation-in-part of application No. 12/339,338, filed on Dec. 19, 2008, now Pat. No. 8,059,447, and a continuation-in-part of application No. 12/339,313, filed on Dec. 19, 2008, now Pat. No. 7,869,258.

(60) Provisional application No. 61/076,553, filed on Jun. 27, 2008.

(51) Int. Cl.
*G11C 11/00* (2006.01)

(52) U.S. Cl.
USPC .......... 365/148; 365/163; 365/171; 365/173; 365/158; 365/174

(58) Field of Classification Search
USPC ................. 365/148, 163, 171, 173, 174, 175, 365/158
See application file for complete search history.

(56) References Cited

U.S. PATENT DOCUMENTS

| | | | |
|---|---|---|---|
| 7,220,982 B2 * | 5/2007 | Campbell | 257/3 |
| 8,023,310 B2 * | 9/2011 | Fu et al. | 365/148 |
| 2006/0250836 A1 * | 11/2006 | Herner et al. | 365/148 |
| 2006/0250837 A1 * | 11/2006 | Herner et al. | 365/148 |
| 2008/0232161 A1 * | 9/2008 | Choi et al. | 365/163 |
| 2009/0115498 A1 * | 5/2009 | Al-Shamma et al. | 327/536 |

OTHER PUBLICATIONS

P.K. Chu, L. Li/ Materials Chemistry and Physics 96 (2006) 253-277.*

* cited by examiner

*Primary Examiner* — Vu Le
*Assistant Examiner* — Han Yang
(74) *Attorney, Agent, or Firm* — The Marbury Law Group PLLC

(57) ABSTRACT

A method of programming a nonvolatile memory cell. The nonvolatile memory cell includes a diode steering element in series with a carbon storage element The method includes providing a first voltage to the nonvolatile memory cell. The first voltage reverse biases the diode steering element. The carbon storage element sets to a lower resistivity state.

26 Claims, 19 Drawing Sheets

METHOD OF PROGRAMMING A NONVOLATILE MEMORY CELL BY REVERSE BIASING A DIODE STEERING ELEMENT TO SET A STORAGE ELEMENT

CROSS-REFERENCE TO RELATED PATENT APPLICATIONS

This application is a Continuation-In-Part of U.S. application Ser. No. 12/318,021, filed Dec. 19, 2008, entitled "Programming A Memory Cell With A Diode In Series By Applying Reverse Bias" incorporated herein by reference in its entirety. This application is also a Continuation-In-Part of U.S. application Ser. No. 12/339,338, filed Dec. 19, 2008, entitled "Capacitive Discharge Method for Writing to an NVM," which claims the benefit of provisional application 61/076,553 filed on Jun. 27, 2008, which is incorporated herein by reference in its entirety. This application is also a Continuation-In-Part of U.S. application Ser. No. 12/339,313, filed Dec. 19, 2008, entitled "Reverse Set with Current Limit for Non-Volatile Storage," which claims the benefit of provisional application 61/076,553 filed on Jun. 27, 2008, which is incorporated herein by reference in its entirety.

BACKGROUND

The present invention relates generally to the field of memory devices and more specifically to the field of nonvolatile memory devices containing diode steering elements.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'. In a one diode, one resistivity switching material memory cell, the state of the memory cell is programmed by forward biasing the diode. However, the current that surges through the diode of a memory cell when the resistivity switching material changes state during forward biasing can be difficult to control.

SUMMARY

One embodiment relates to method of programming a nonvolatile memory cell. The nonvolatile memory cell includes a diode steering element in series with a carbon storage element The method includes providing a first voltage to the nonvolatile memory cell. The first voltage reverse biases the diode steering element. The carbon storage element sets to a lower resistivity state.

Another embodiment relates to a method of programming a nonvolatile memory cell array. The nonvolatile memory cell array includes a plurality of X lines, a plurality of Y lines, and a plurality of memory cells. Each memory cell includes a diode steering element in series with a carbon storage element. Each memory cell can be electrically connected between one of the plurality of X lines and one of the plurality of Y lines. A selected X line of the plurality of X lines associated with at least one selected memory cell of the plurality of memory cells is driven to a X line select voltage. At least one selected Y line of the plurality of Y lines associated with the at least one selected memory cell is driven to a Y line select voltage. The X line select voltage and the Y line select voltage are configured such that a diode steering element of the at least one selected memory cell is reverse biased. The at least one selected Y line of the plurality of Y lines is isolated before a carbon storage element of the at least one selected memory cell is completely set to a lower resistivity state. The at least one selected Y line is held in an isolated state until the carbon storage element of the at least one selected memory cell is completely set to the lower resistivity state.

Another embodiment relates to a method of programming a nonvolatile memory cell. A temperature of at least one memory cell or a chip comprising the at least one memory cell is sensed. The at least one memory cell includes a steering element and a storage element. A setting voltage is selected based on the sensed temperature. The setting voltage is provided to the at least one memory cell, such that the steering element is reverse biased and the storage element is set to a lower resistivity state.

DETAILED DESCRIPTION

A structure for and method of programming a nonvolatile memory cell by reverse biasing a diode steering element to set a storage element are described. In the following description, for purposes of explanation, numerous specific details are set forth to provide a thorough understanding of exemplary embodiments of the invention. It will be evident, however, to one skilled in the art that the invention may be practiced without these specific details. The drawings are not to scale. In other instances, well-known structures and devices are shown in simplified form to facilitate description of the exemplary embodiments.

Figure 1:
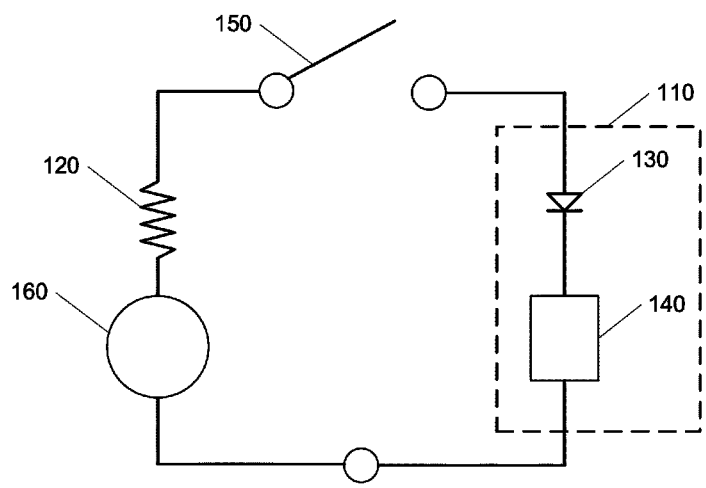
FIG. 1 is a schematic of a memory cell with a temporary resistor in accordance with a representative embodiment.

Referring to FIG. 1, a schematic of a memory cell 110 with a temporary resistor 120 in accordance with a representative embodiment is shown. The memory cell 110 includes a diode 130 and a resistivity switching material element 140. Alternatively, the memory cell 110 can include multiple diodes; for example, a diode can be located on both sides of the resistivity switching material element. In one embodiment, a second diode is also included in the memory cell. The memory cell 110 is part of a memory cell array in a memory device. During programming, the temporary resistor 120 and a voltage source 160 are electrically connected to the memory cell 110 by a switch 150. The memory cell 110 and the voltage source 160 are grounded together.

The diode 130 can be any suitable diode, such as a semiconductor diode. Examples of a semiconductor diode include p-n and p-i-n semiconductor diodes formed in single crystal, polycrystalline or amorphous semiconductor material, such as silicon, germanium, silicon-germanium or compound semiconductors, such as Group III-V or II-VI semiconductors. Alternatively, the diode 130 can be a metal insulator metal (MIM) diode, a metal insulator-insulator metal (MIIM) diode, tunneling diodes, or any two terminal non-linear conducting device.

The resistivity switching material element 140 is preferably a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistivity material, a phase change material, a conductive bridge element, an electrolyte switching material, a switchable polymer material, or carbon resistivity switching material, such as amorphous, polycrystalline or microcrystalline carbon or graphite material.

The temporary resistor 120 can be any suitable resistor. For example the resistor can be a standard wire-wound resistor, a surface mounted resistor, or integrated into the same die as the memory cell 110. The temporary resistor 120 can be any value; however, the temporary resistor 120 should be selected to provide current limiting protection for the diode 130. Additionally, multiple resistors can be used to create an effective resistance.

The temporary resistor 120, the voltage source 160 and the switch 150 can be part of a driving circuitry of the memory device. The driving circuitry includes circuitry for reading and writing the memory cells of the memory cell array. The temporary resistor 120 is used to program (write), but not read, the memory cell 110. The driving circuitry also includes addressing logic used to individually address the individual memory cells of the memory cell array. Hence, one temporary resistor can be used to program the entire memory cell array. The switch 150 also allows the temporary resistor 120 to be disconnected. For example, the temporary resistor 120 can be disconnected from the memory cell 110 while the memory cell 110 is being read or reset by the other driving circuitry.

Figure 2:
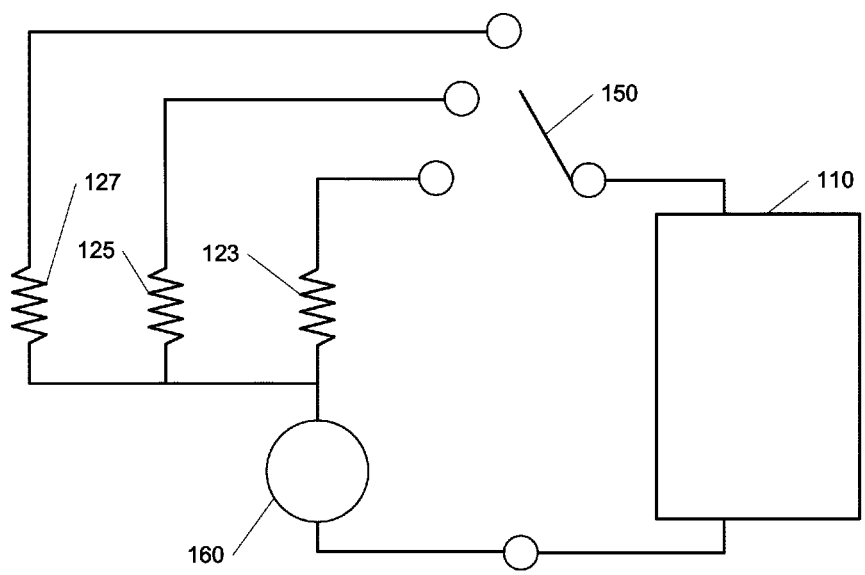
FIG. 2 is a schematic of a memory cell with multiple temporary resistors in accordance with a representative embodiment.

Referring to FIG. 2, a schematic of a memory cell 110 with multiple temporary resistors in accordance with a representative embodiment is shown. The memory cell 110 includes a diode and a resistivity switching material element. The memory cell 110 is part of a memory cell array in a memory device. During programming, a first temporary resistor 123, a second temporary resistor 125, or a third temporary resistor 127 and a voltage source 160 are electrically connected to the memory cell 110 by a switch 150. In one example, the first temporary resistor 123 is a 100 kΩ resistor, the second temporary resistor 125 is a 400 kΩ resistor, and the third temporary resistor 127 is a 800 kΩ resistor. The memory cell 110 and the voltage source 160 are grounded together.

Figure 3:
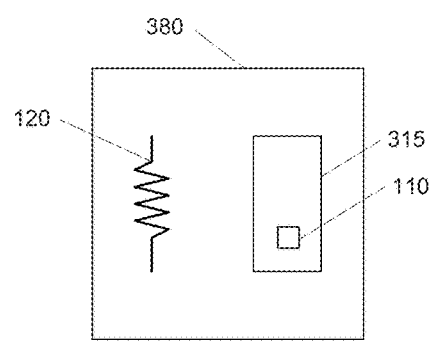
FIG. 3 is a top view of a memory cell located on the same chip as a temporary resistor in accordance with a representative embodiment.

Referring to FIG. 3, a top view of a memory cell 110 located on the same chip as a temporary resistor 120 in accordance with a representative embodiment is shown. The memory cell 110 is part of an array of memory cells 315. The temporary resistor 120 and the array of memory cells 315 can be integrated on a microchip 380. Where a temporary resistor and a memory cell are included in the same device, a switch or transistor is included to electrically isolate the resistor so that the memory cell can be read, reset, or programmed using other techniques. Alternatively, temporary resistor 120 and the array of memory cells 315 can be on separate chips but integrated into a single package.

Figure 4:
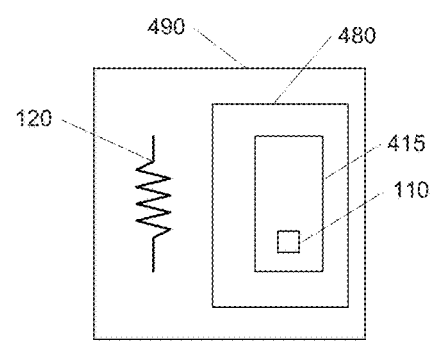
FIG. 4 is a top view of a memory cell located on the same circuit board as a temporary resistor in accordance with a representative embodiment.

Referring to FIG. 4, a top view of a memory cell 110 located on the same circuit board as a temporary resistor 120 in accordance with a representative embodiment is shown. The memory cell 110 is part of an array of memory cells 415 that are located on a memory device 480. The memory device 480 is an encapsulated semiconductor package. The temporary resistor 120 and the memory device 480 can be integrated on a printed circuit board 490. Where a temporary resistor and a memory cell are included in the same circuit board, a switch or transistor is included to electrically isolate the resistor so that the memory cell can be read, reset, or programmed using other techniques. The switch and other driving logic can be located in the memory device 480 or as a separate device located on the printed circuit board 490.

Figure 5:
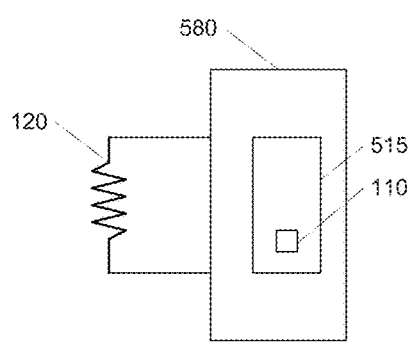
FIG. 5 is a top view of a memory cell separate from a temporary resistor in accordance with a representative embodiment.

Referring to FIG. 5, a top view of a memory cell 110 separate from a temporary resistor 120 in accordance with a representative embodiment is shown. The memory cell 110 is part of an array of memory cells 515 that are located on a memory device 580. The temporary resistor 120 can be removable. For example, at a processing plant the temporary resistor 120 can be temporarily attached to the memory device 580. After programming, the temporary resistor 120 is removed. The memory device 580 can then be assembled into other products or shipped to another plant for further assembly. Likewise, the voltage source can be part of an integrated device including memory cells or the voltage source can be removable.

Figure 6:
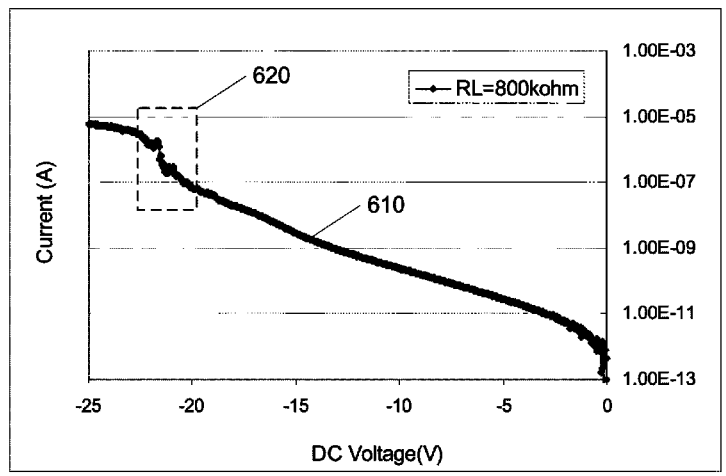
FIG. 6 is a graph of setting a memory cell with a 800 kΩ resistor in accordance with a representative embodiment.

Referring to FIG. 6, a graph of setting a memory cell with a 800 kΩ resistor in accordance with a representative embodiment is shown. During programming, a reverse bias can be applied to a memory cell by a voltage source using a temporary resistor in series with the memory cell. In this example, the temporary resistor is a 800 kΩ resistor. The memory cell includes a diode and a resistivity switching material element. In this example, the diode is a p-i-n diode fabricated using a 0.5 µm process, and a resistivity switching material element made of $HfO_2$.

A high reverse voltage (Vdiode+Vset) is applied on the memory cell as depicted by I-V (current-voltage) curve 610. When the reverse bias voltage reaches a switching point 620, the state of the resistivity switching material element changes from a first initial state to a second state different from the first state. The switching point is, for example, about −15 volts to −25 volts across the temporary resistor, the diode, and the resistivity switching material element. The switching point approximately occurs at a reverse bias threshold voltage that depends on diode reverse leakage characteristics of the diode and a threshold voltage required to set the resistivity switching material element, which vary based on the type of diode, and the type of resistivity switching material element. The change is substantial; however, the change can be gradual.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring. The diode remains operational, but the resistivity switching material element has changed state. From any state, the memory cell can be returned, substantially, to its initial (original) state by applying a forward bias to the memory cell without the temporary resistor. A substantially initial state is any state within about the bounds of the definition of the initial state as defined by a reading circuit.

Figure 7:
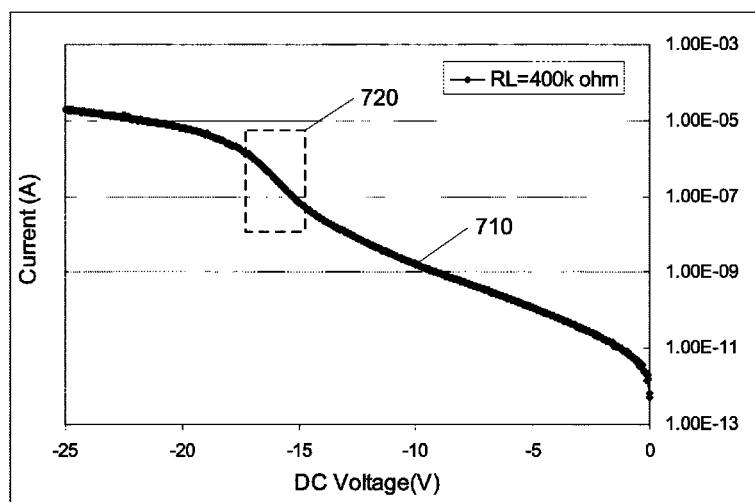
FIG. 7 is a graph of setting a memory cell with a 400 kΩ resistor in accordance with a representative embodiment.

After the memory cell has been changed to the second state, a reverse bias can be applied to the memory cell by the voltage source using a second temporary resistor in series with the memory cell. Referring to FIG. 7, a graph of setting a memory cell with a 400 kΩ resistor in accordance with a representative embodiment is shown. In this example, the temporary resistor is a 400 kΩ resistor. In this example, the memory cell has already been programmed with a 800 kΩ as in FIG. 6.

A high reverse voltage (Vdiode+Vset) is applied on the memory cell as depicted by I-V (current-voltage) curve 710. When the reverse bias voltage reaches a switching point 720, the state of the resistivity switching material element changes from the second state to a third state different from the second state or the first state. The switching point is, for example, about −15 volts to −25 volts across the temporary resistor, the diode, and the resistivity switching material element. The switching point approximately occurs at a reverse bias threshold voltage that depends on diode reverse leakage characteristics of the diode and a threshold voltage required to set the resistivity switching material element, which vary based on the type of diode, and the type of resistivity switching material element. The change is substantial; however, the change can be gradual.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring. The diode remains operational, but the resistivity switching material element has changed state. From any state, the memory cell can be returned, substantially, to its initial (original) state by applying a forward bias to the memory cell without the temporary resistor.

Figure 8:
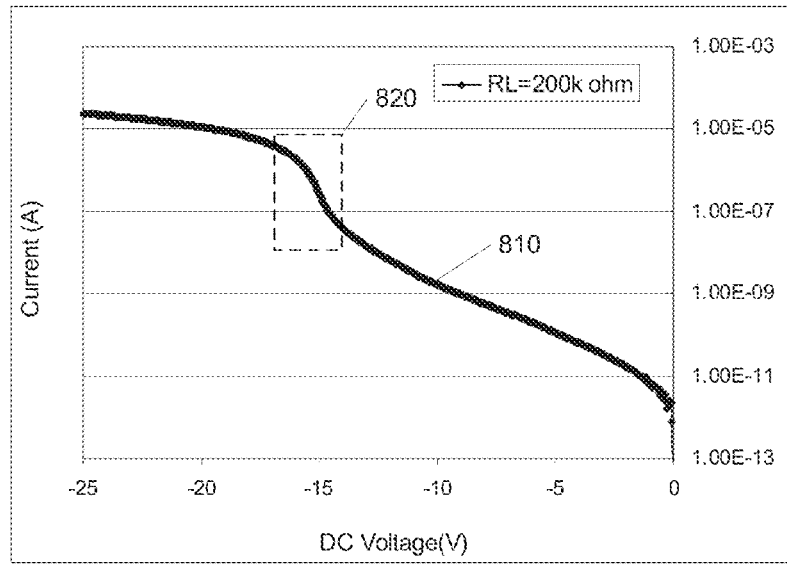
FIG. 8 is a graph of setting a memory cell with a 200 kΩ resistor in accordance with a representative embodiment.

After the memory cell has been changed to the third state, a reverse bias can be applied to the memory cell by the voltage source using a third temporary resistor in series with the memory cell. Referring to FIG. 8, a graph of setting a memory cell with a 200 kΩ resistor in accordance with a representative embodiment is shown. In this example, the temporary resistor is a 200 kΩ resistor. In this example, the memory cell has already been programmed with a 400 kΩ as in FIG. 7.

A high reverse voltage (Vdiode+Vset) is applied on the memory cell as depicted by I-V (current-voltage) curve 810. When the reverse bias voltage reaches a switching point 820, the state of the resistivity switching material element changes from the third state to a fourth state different from the third state, the second state or the first state. The switching point is, for example, about −15 volts to −25 volts across the temporary resistor, the diode, and the resistivity switching material element. The switching point approximately occurs at a reverse bias threshold voltage that depends on diode reverse leakage characteristics of the diode and a threshold voltage required to set the resistivity switching material element, which vary based on the type of diode, and the type of resistivity switching material element. The change is substantial; however, the change can be gradual.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring. The diode remains operational, but the resistivity switching material element has changed state. From any state, the memory cell can be returned, substantially, to its initial (original) state by applying a forward bias to the memory cell without the temporary resistor.

Figure 9:
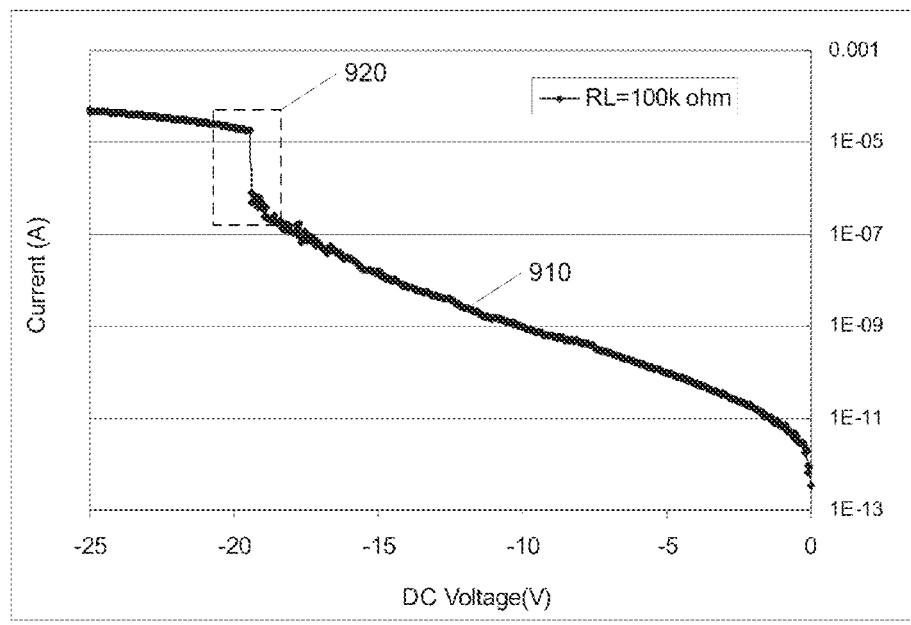
FIG. 9 is a graph of setting a memory cell with a 100 kΩ resistor in accordance with a representative embodiment.

After the memory cell has been changed to the fourth state, a reverse bias can be applied to the memory cell by the voltage source using a fourth temporary resistor in series with the memory cell. Referring to FIG. 9, a graph of setting a memory cell with a 100 kΩ resistor in accordance with a representative embodiment is shown. In this example, the temporary resistor is a 100 kΩ resistor. In this example, the memory cell has already been programmed with a 200 kΩ as in FIG. 8.

A high reverse voltage (Vdiode+Vset) is applied on the memory cell as depicted by I-V (current-voltage) curve 910. When the reverse bias voltage reaches a switching point 920, the state of the resistivity switching material element changes from the fourth state to a fifth state different from the fourth state, the third state, the second state or the first state. The switching point is, for example, about −15 volts to −25 volts across the temporary resistor, the diode, and the resistivity switching material element. The switching point approximately occurs at a reverse bias threshold voltage that depends on diode reverse leakage characteristics of the diode and a threshold voltage required to set the resistivity switching material element, which vary based on the type of diode, and the type of resistivity switching material element. The change is substantial; however, the change can be gradual.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring. The diode remains operational, but the resistivity switching material element has changed state. From any state, the memory cell can be returned, substantially, to its initial (original) state by applying a forward bias to the memory cell without the temporary resistor.

Figure 10:
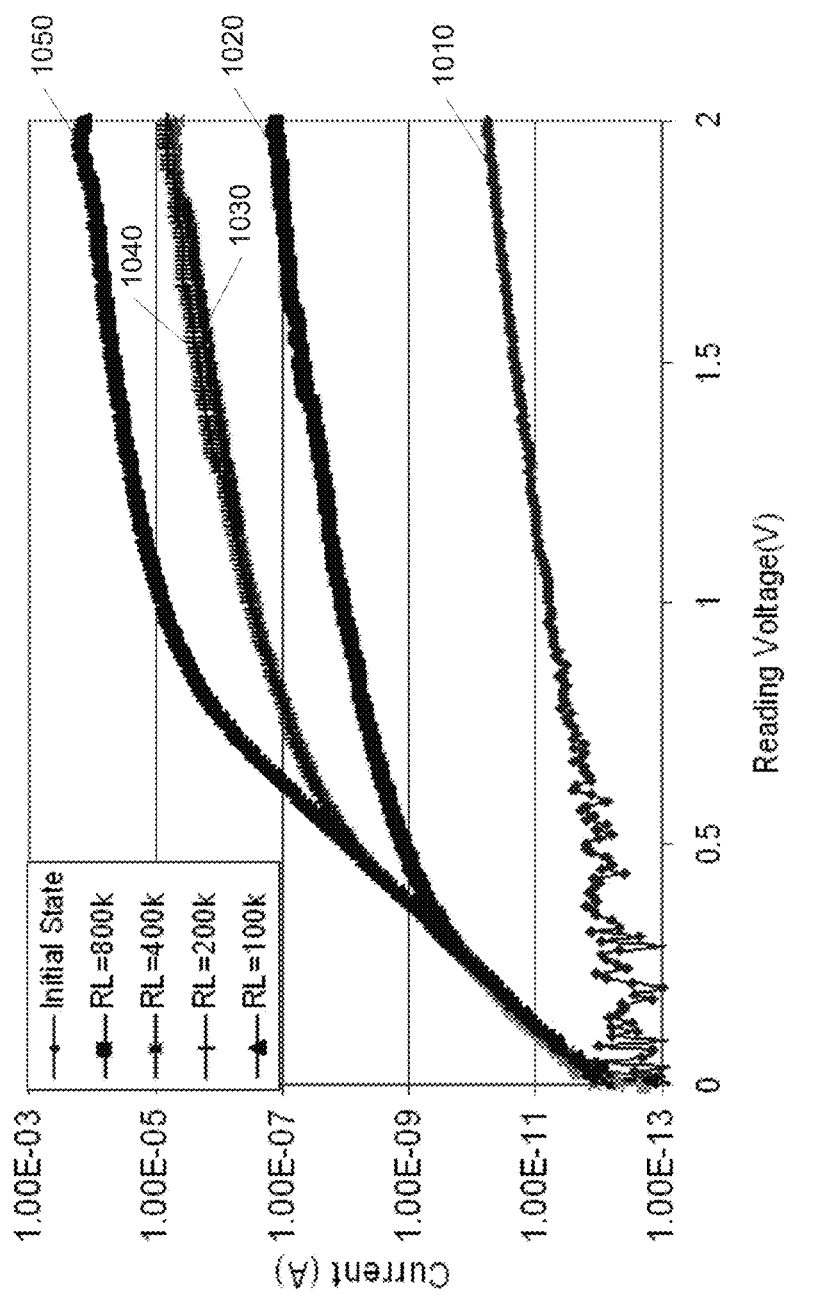
FIG. 10 is a graph comparing reading a memory cell by applying a forward bias in multiple states in accordance with a representative embodiment.

The memory cell can be read by applying a forward bias to the diode. Referring to FIG. 10, a graph comparing reading a memory cell by applying a forward bias in multiple states in accordance with a representative embodiment is shown. During reading, a forward bias can be applied to a memory cell by a voltage source without using a temporary resistor in series with the memory cell. As above, the diode is a p-i-n diode fabricated using a 0.5 μm process, and a resistivity switching material element made of $HfO_2$.

Because different temporary resistors limit the reverse current to different levels, the memory cell is set to different states. Additionally, the memory cell has distinct states before and after programming. Each state has a different I-V (current-voltage) profile.

FIG. 10 shows I-V profiles of a memory cell read after being programmed with various temporary resistors. The first I-V profile 1010 shows the current readings when an un-programmed memory cell is forward biased from 0V to 2V. For example, the current reading at a forward bias of 2V is about 2.00E-11 A. The second I-V profile 1020 shows the current readings when a memory cell programmed with a 800 kΩ resistor is forward biased from 0V to 2V. For example, the current reading at a forward bias of 2V is about 1.00E-7 A. The third I-V profile 1030 shows the current readings when a memory cell programmed with a 400 kΩ resistor is forward biased from 0V to 2V. For example, the current reading at a forward bias of 2V is about 2.00E-5 A. The fourth I-V profile 1040 shows the current readings when a memory cell programmed with a 200 kΩ resistor is forward biased from 0V to 2V. For example, the current reading at a forward bias of 2V is about 1.50E-5 A. The fifth I-V profile 1050 shows the current readings when a memory cell programmed with a 100 kΩ resistor is forward biased from 0V to 2V. For example, the current reading at a forward bias of 2V is about 1.00E-4 A. Hence, for at least in the 0.75V to 2V range, the memory cells programmed with distinct resistors produce distinct current readings.

Advantageously, the different states of a resistivity switching material element can represent different data values in a rewritable or one-time programmable memory. For example, an initial state can represent data value '00'; a state created with a 800 kΩ resistor can represent data value '01'; a state created with a 400 kΩ resistor can represent data value '10'; and a state created with a 100 kΩ resistor can represent data value '11'. Hence, any number of states and, therefore, data values can be stored in the resistivity switching material elements based upon the number of resistors available and the sensitivity of the reading circuit. Resistors can be combined in series and parallel to increase the number of resistance values available while reducing the number of resistors needed.

Figure 11:
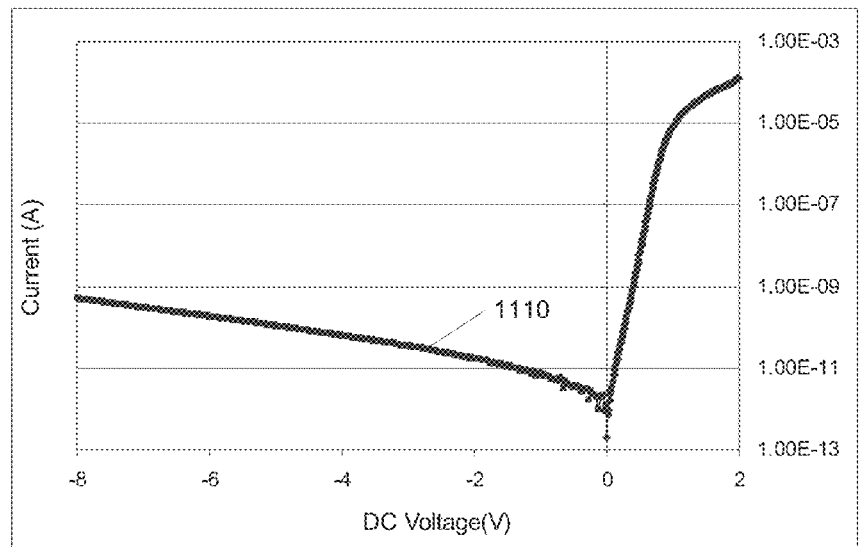
FIG. 11 is a graph depicting an I-V profile of a diode in a memory cell after being programmed with a 100 kΩ resistor in accordance with a representative embodiment.

After programming, the diode in the memory cell remains operational. Referring to FIG. 11, a graph depicting an I-V profile 1110 of a diode in a memory cell after being programmed with a 100 kΩ resistor in accordance with a representative embodiment is shown. As above, the diode is a p-i-n diode fabricated using a 0.5 μm process, and a resistivity switching material element made of HfO2. In this example, the memory cell was programmed using a 100 kΩ resistor. The I-V profile 1110 was created by forward biasing the diode from the memory cell from −8V to 2V without the 100 kΩ resistor. I-V profile 1110 shows the I-V curve of a working diode; specifically, the curve show the traditional switching effect at 1V. Advantageously, programming the memory cell using a reverse bias with temporary resistor technique does not damage the diode.

Figure 12:
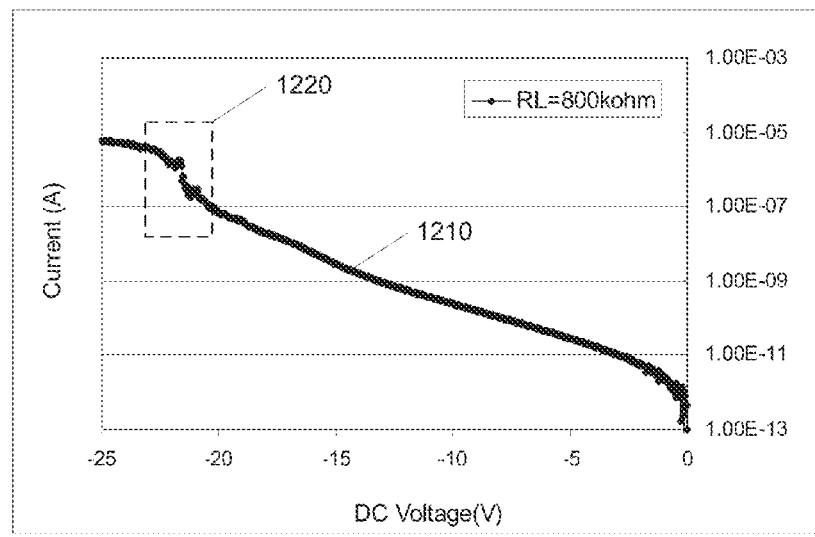
FIG. 12 is a graph depicting an I-V profile of setting a fresh memory cell with a 800 kΩ resistor in accordance with a representative embodiment.

Advantageously, fresh memory cells produce repeatable results. Referring to FIG. 12, a graph depicting an I-V profile of setting a fresh memory cell with a 800 kΩ resistor in accordance with a representative embodiment is shown. In this example, a reverse bias is applied to a fresh (un-programmed) memory cell by a voltage source using a 800 kΩ temporary resistor in series with the memory cell. The memory cell includes a p-i-n diode fabricated using a 0.5 μm process, and a resistivity switching material element made of $HfO_2$.

A high reverse voltage (Vdiode+Vset) is applied on the memory cell as depicted by I-V (current-voltage) curve 1210. When the reverse bias voltage reaches a switching point 1220, the state of the resistivity switching material element changes from a first initial state to a second state different from the first state. The switching point is about −15 volts to −25 volts across the temporary resistor, the diode, and the resistivity switching material element.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring.

Figure 13:
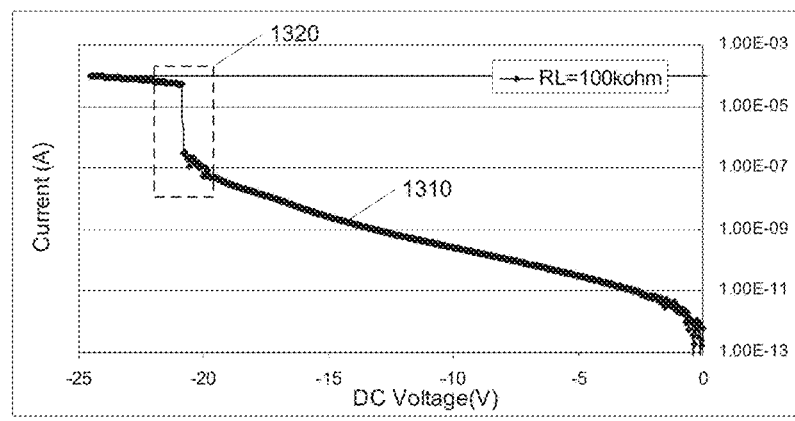
FIG. 13 is a graph depicting an I-V profile of setting a second fresh memory cell with a 100 kΩ resistor in accordance with a representative embodiment.

Referring to FIG. 13, a graph depicting an I-V profile of setting a second fresh memory cell with a 100 kΩ resistor in accordance with a representative embodiment is shown. In this example, a reverse bias is applied to a fresh (un-programmed) memory cell by a voltage source using a 100 kΩ temporary resistor in series with the memory cell. The memory cell includes a p-i-n diode fabricated using a 0.5 μm process, and a resistivity switching material element made of $HfO_2$.

A high reverse voltage (Vdiode+Vset) is applied on the memory cell as depicted by I-V (current-voltage) curve 1310. When the reverse bias voltage reaches a switching point 1320, the state of the resistivity switching material element changes from a first initial state to a second state different from the first state. The switching point is about −15 volts to −25 volts across the temporary resistor, the diode, and the resistivity switching material element.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring.

Figure 14:
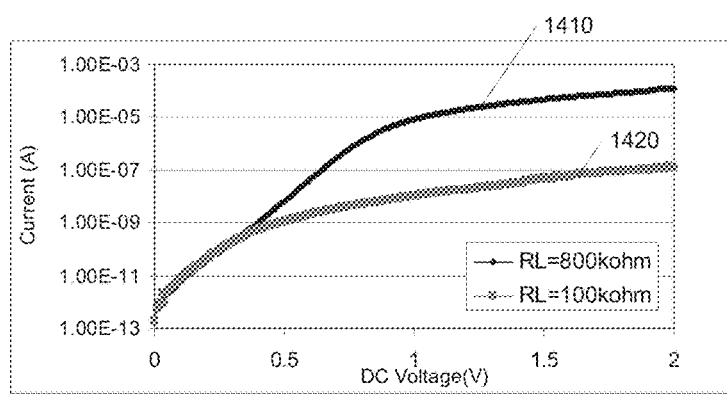
FIG. 14 is a graph comparing readings from a first fresh memory cell programmed with a 800 kΩ resistor and a second fresh memory cell programmed with a 100 kΩ resistor in accordance with a representative embodiment.

Referring to FIG. 14, a graph comparing readings from a first fresh memory cell programmed with a 800 kΩ resistor and a second fresh memory cell programmed with a 100 kΩ resistor in accordance with a representative embodiment is shown. The first I-V profile 1410 shows the current readings when the first fresh memory cell, programmed with the 100 kΩ resistor, is forward biased from 0V to 2V. For example, the current reading at a forward bias of 2V is about 1.00E-4 A. The second I-V profile 1420 shows the current readings when the second fresh memory cell, programmed with the 800 kΩ resistor, is forward biased from 0V to 2V. For example, the current reading at a forward bias of 2V is about 1.00E-7 A. Hence, for at least in the 0.75V to 2V range, the memory cells programmed with distinct resistors produce distinct current readings. Additionally, the first I-V profile 1410 of the first fresh memory cell, programmed with the 100 kΩ resistor, matches the I-V profile of the memory cell programmed with a 100 kΩ resistor of FIG. 10 (the memory cell of FIG. 10 was programmed multiple times). Likewise, the second I-V profile 1420 of the second fresh memory cell, programmed with the 800 kΩ resistor, matches the I-V profile of the memory cell programmed with a 800 kΩ resistor of FIG. 10 (the memory cell of FIG. 10 was programmed multiple times).

Reverse Bias of a Memory Cell with a Carbon Storage Element

In another embodiment, the external resistor 120 shown in FIG. 1 of the prior embodiment can be omitted, if desired. In this embodiment, the storage element comprises a carbon storage element, and the reliability of setting and resetting the carbon storage element can be improved. In a typical forward bias situation, a carbon storage element, such as a carbon nanotube material, has long SET times and high RESET voltages. The SET time for a carbon storage element is in the ranges of milliseconds. High RESET voltages are used because the SET voltages are high and variable. The RESET voltages are usually higher than the SET voltages.

A carbon storage element is SET when a resistivity state of the carbon storage element is changed from a higher resistivity to a lower resistivity. A carbon storage element is RESET when a resistivity state of the carbon storage element is changed from a lower resistivity to a higher resistivity. A carbon storage element can be a resistivity switching material selected from a carbon nanotube material, an amorphous or a polycrystalline carbon resistivity switching material, a graphene switchable resistance material, or a combination thereof. Without wishing to be bound by a particular theory, the inventors believe that when a SET voltage is applied across a carbon storage element, linkages are formed between portions of a carbon material of the carbon storage element. For example, where the carbon storage element includes carbon nanotubes, linkages or filaments are formed between at least some of the carbon nanotubes when a SET voltage is applied thereby increasing the conductivity of the carbon storage element. When a RESET voltage is applied, the RESET voltage/current causes the linkages or filaments between the carbon nanotubes to be degraded or destroyed thereby decreasing the conductivity of the carbon storage element. Thus, the RESET voltage/current should be higher than the SET voltage/current in order to degrade or destroy the linkages. When the SET current is high and/or variable, the RESET current must be that much higher in order to maintain consistent performance. The higher voltages and currents result in wasted power and shorter lifetimes in a memory array. A carbon storage element is typically formed in the SET state. Before programming an array of memory cells for the first time, it is common to RESET the carbon storage elements.

Figure 15:
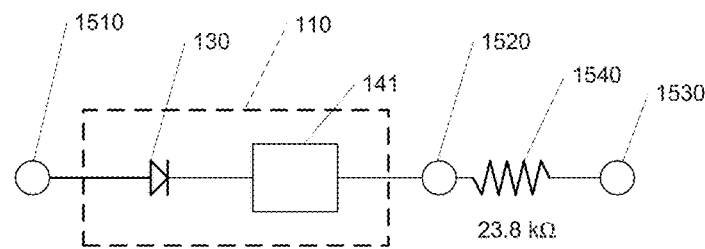
FIG. 15 is a schematic of a carbon storage element test circuit in accordance with a representative embodiment.

Referring to FIG. 15, a schematic of a carbon storage element test circuit in accordance with a representative embodiment is shown. The test circuit includes a carbon storage element 141 in series with a resistor 1540, such as a 23.8 kiloOhm resistor. The carbon storage element 141 can be part of a memory cell array in a memory device. The test circuit includes test points 1510, 1520, and 1530. The carbon storage element 141 is initially in a RESET state (high resistance).

Figure 16:
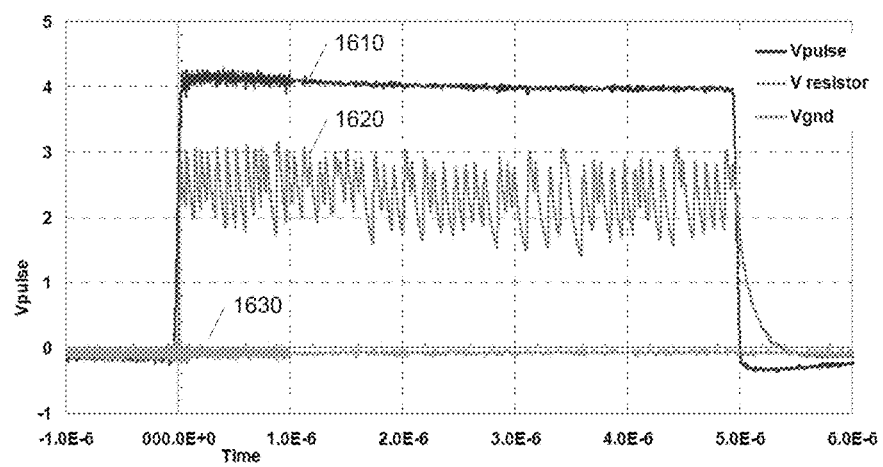
FIG. 16 is a graph of pulse voltage versus time for a forward bias of the carbon storage element test circuit of FIG. 15 in accordance with a representative embodiment.

Referring to FIG. 16, a graph of a forward bias of the carbon storage element test circuit of FIG. 15 in accordance with a representative embodiment is shown. The graph shows the voltage (V) versus time (seconds) for various test points of the carbon storage element test circuit of FIG. 15 in a forward biased state. Plot 1610 shows the voltage of a forward biasing pulse applied across test points 1510 and 1530. The forward biasing pulse lasts for approximately 5 microseconds. Plot 1620 shows the voltage measured across test points 1520 and 1530, or the voltage across the resistor 1540. Plot 1630 shows the ground voltage relative to the test equipment (not shown).

Plot 1620 shows that the voltage across the resistor 1540 jumps or chatters between about 2 and 3 V while the forward biasing pulse is applied. The chattering is caused by the storage element 141 setting and resetting because too much current is available after the storage element 141 sets. For example, the carbon storage element 141 is initially in a RESET state (high resistance). When the carbon storage element 141 sets (low resistance) the carbon storage element 141 continues to conduct and the available current from the test circuit is still capable of resetting the carbon storage element 141. As described above, the inventors believe that the chattering is caused by the formation and destruction of filaments or linkages in the carbon material during the SET and RESET operations.

In previous approaches, a CMOS control element is used during the SET and the RESET operations. After a SET operation, the CMOS control can continue to provide high current to a storage element due to surge and the capacitance of the MOS device. Hence, the chatter is not completely eliminated.

Figure 17:
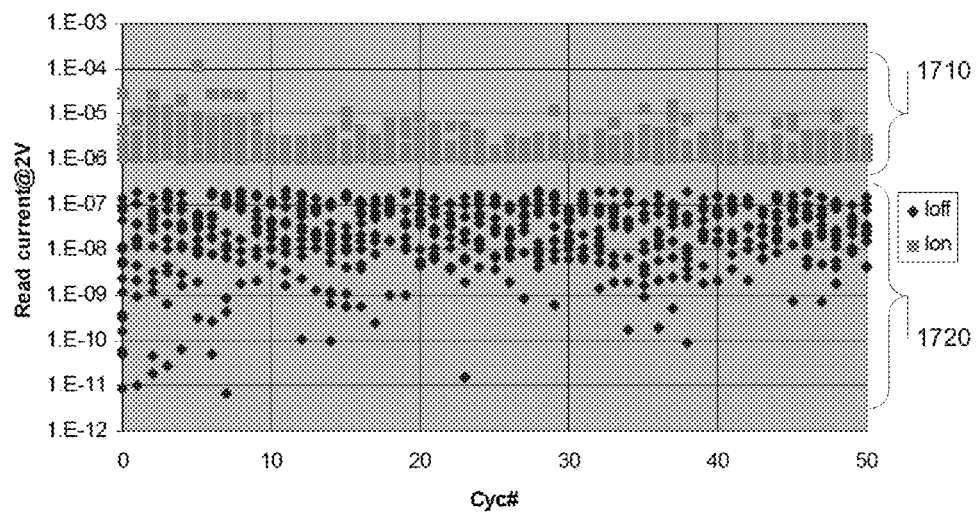
FIG. 17 is a graph of read current at 2V variability for ten forward biased carbon storage element memory cells in accordance with a representative embodiment.

Referring to FIG. 17, a graph of read current variability for ten forward biased carbon storage element memory cells in accordance with a representative embodiment is shown. The graph shows the read current (Read current @2V) (A) versus set/reset cycles (Cyc#) for the ten carbon storage element memory cells where the carbon storage element is SET and RESET by forward biasing the diode of the memory cell. Plots 1710 are the read current measurements for memory cells in the SET state (Ion). Plots 1720 are the read current measurements for memory cells in the RESET state (Ioff). Plots 1710 and 1720 show that the variation in the SET state can cause variation in the RESET state. Thus, improved methods of and structures for controlling the SET current after SET are needed.

Figure 18:
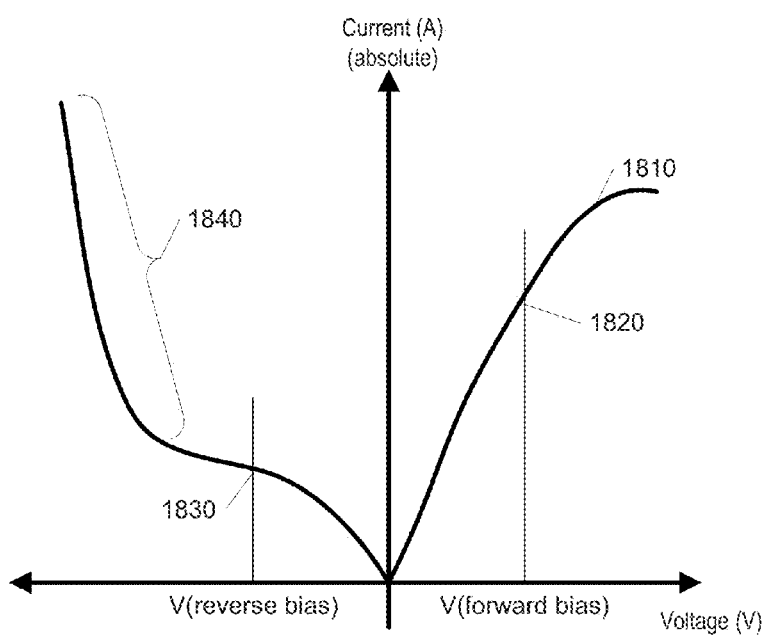
FIG. 18 is a current-voltage graph of a diode of a memory cell in accordance with a representative embodiment.

Referring to FIG. 18, a current-voltage (I-V) graph of a diode of a memory cell in accordance with a representative embodiment is shown. The graph shows the absolute current (A) versus voltage (V) for a diode of a memory cell in a memory array. Plot 1810 shows the current of the diode in reverse bias and in forward bias. Area 1840 is the breakdown region of the diode in reverse bias. When the diode is forward biased, such as at point 1820, there is much more current available then when the diode is reverse biased, such as at point 1830. Notably, the reverse bias area of plot 1810 shows that reverse bias current is very flat compared to the forward bias current. Thus, the current in reverse bias can be controlled with much more precision.

Figure 19:
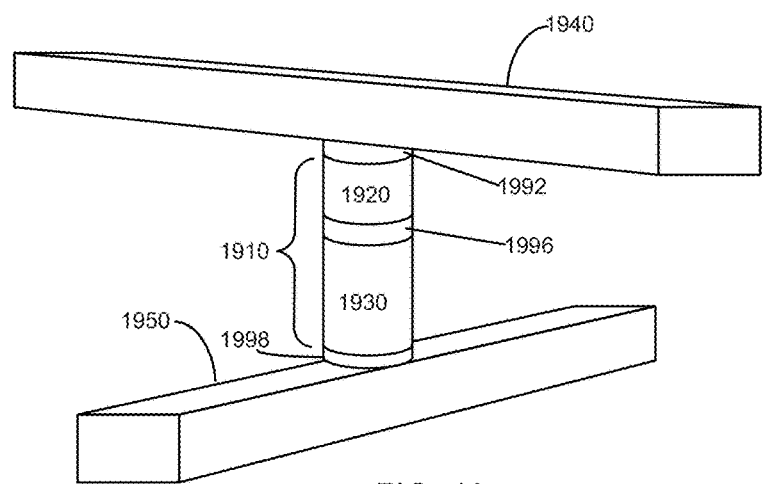
FIG. 19 is a perspective view of a memory cell in accordance with a representative embodiment.

Referring to FIG. 19, a perspective view of a memory cell 1910 in accordance with a representative embodiment is shown. The memory cell 1910 includes a diode steering element 1930 and a carbon storage element 1920 electrically connected in series. The diode steering element 1930 and the carbon storage element 1920 can be pillar shaped. The diode steering element 1930 can be located over or under the storage element 1920. The memory cell 1910 can be located in a monolithic three dimensional array of nonvolatile memory cells.

The carbon storage element 1920 can be electrically connected to a bit line 1940. The diode steering element 1930 can be electrically connected to a word line 1950. The bit line 1940 and the word line 1950 can each be can be any one or more metals or conductors, for example, aluminum, copper, titanium nitride, tungsten, titanium, titanium silicide, etc. The carbon storage element 1920 and the bit line 1940 can be connected by a contact 1992. The diode steering element 1930 and the carbon storage element 1920 can be connected by a contact 1996. The diode steering element 1930 and the word line 1950 can be connected by a contact 1998. The contacts can be any one or more metals or conductors, for example, titanium nitride, tungsten, titanium, titanium silicide, etc. The diode steering element 1930 and the carbon storage element 1920 can be a nonvolatile memory cell located over a lower electrode, such as word line 1950 and under an upper electrode, such as bit line 1940. Alternatively, line 1950 may be a bit line and line 1940 may be a word line.

The diode steering element 1930 can be a p-n semiconductor diode, a p-i-n semiconductor diode, or a punch-through diode. Alternatively, the diode steering element 1930 can be a metal insulator metal (MIM) diode, a metal insulator-insulator metal (MIIM) diode, a tunneling diode, or any two terminal non-linear conducting device. The diode steering element 1930 can be made of polysilicon, single crystal silicon, amorphous silicon or a combination thereof. Other semiconductor materials, such as Ge, SiGe, III-V materials, etc. may also be used.

The carbon storage element 1920 can be a resistivity switching material selected from a carbon nanotube material, an amorphous or a polycrystalline carbon resistivity switching material, a graphene switchable resistance material, or a combination thereof.

Figure 20:
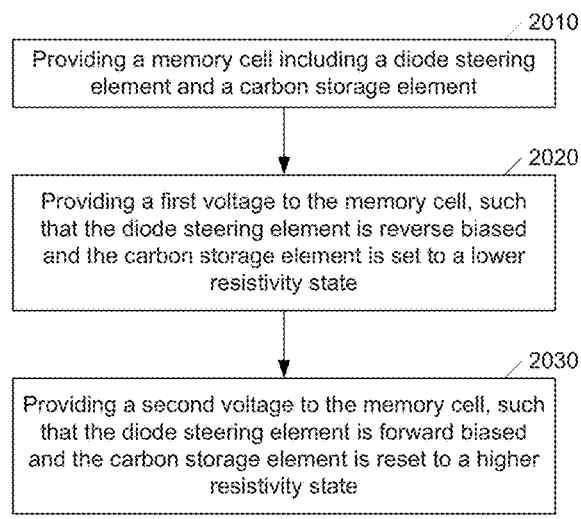
FIG. 20 is a flowchart of programming the memory cell of FIG. 19 in accordance with a representative embodiment.

Referring to FIG. 20, a flowchart of programming the memory cell of FIG. 19 in accordance with a representative embodiment is shown. Additional, fewer, or different operations may be performed depending on the particular embodiment. The operations may also be performed in a different order than that shown and described. In an operation 2010, the memory cell 1910 can be provided. As discussed above, the memory cell 1910 includes a diode steering element 1930 and a carbon storage element 1920.

In an operation 2020, a first voltage can be provided to the memory cell, such that the diode steering element 1930 is reverse biased and the carbon storage element 1920 is SET to a lower resistivity state. The first voltage can be any magnitude, for example, in the range of 2 V to 10 V. The first voltage can be provided by a driving circuit, a capacitive discharge circuit, a capacitive discharge of a charge temporarily stored on the bit line 1940 and the word line 1950, or a voltage pulse.

The capacitive discharge circuit (described further below) and pulse method are disclosed in U.S. patent application Ser. No. 12/339,338, filed Dec. 19, 2008, entitled "Capacitive Discharge Method for Writing to an NVM" which has been incorporated by reference. The first voltage causes a first current to SET the carbon storage element 1920.

In an operation 2030, a second voltage can be provided to the memory cell, such that the diode steering element 1930 is forward biased and the carbon storage element 1920 is RESET to a higher resistivity state. The second voltage causes a second current to RESET the carbon storage element 1920. A magnitude of the second current associated with the second voltage is greater than a magnitude of the first current associated with the first voltage as shown in FIG. 18. The carbon storage element 1920 can be SET and RESET a plurality of times by applying a reverse bias and forward bias, respectively.

Figure 21:
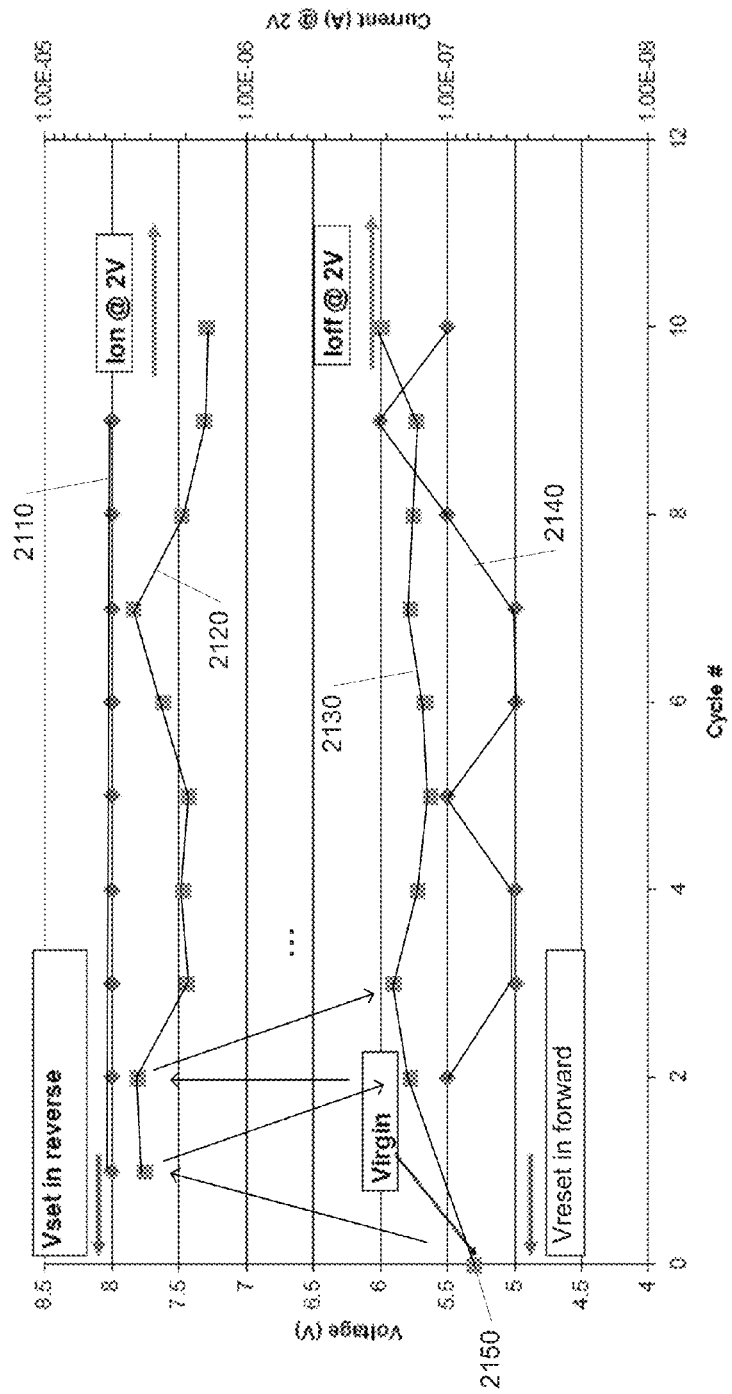
FIG. 21 is a graph of the read current at 2V and programming voltage for multiple programming cycles of the memory cell of FIG. 19 in accordance with a representative embodiment.

Referring to FIG. 21, a graph of the read current and programming voltage for multiple programming cycles of the memory cell of FIG. 19 in accordance with a representative embodiment is shown. FIG. 21 shows data when the SET operation is done in reverse mode and the RESET operation is done in forward mode. On the left scale, the graph shows the voltage (V) used to SET and RESET versus cycle (#) for the memory cell of FIG. 19. Plot 2110 shows the SET voltage used to reverse bias the diode steering element 1930 of the memory cell of FIG. 19. Plot 2140 shows the RESET voltage used to forward bias the diode steering element 1930 of the memory cell of FIG. 19. On the right scale, the graph shows the read current (Current (A) @2V) versus cycle (#) for the memory cell of FIG. 19. Plot 2120 shows the read current taken after the memory cell is SET and forward biased at a read voltage of 2V (Ion@2V). Plot 2130 shows the read current taken after the memory cell is RESET and forward biased at a read voltage of 2V (Ioff@2V). Point 2150 represents the read current of the diode in its virgin state.

The SET times are about 5 microseconds to 50 microseconds and the "on" state (a read current after a set) is controlled between 1.5-4 microamps. The setting voltage is 8V in reverse and there is no diode degradation of the diode steering element 1930.

At the beginning of a SET with reverse bias, most of the voltage is taken up by the carbon storage element 1920 (as the material is in the high resistance state). As the carbon storage element 1920 starts to SET (lower resistance), the voltage then gets distributed between the diode steering element 1930 and the carbon storage element 1920. The SET operation stops at a quiescent point. The current provided in reverse bias cannot be higher than the reverse current (the breakdown current) of the diode steering element 1930 which is limited by the diode's share of the distributed set voltage. Higher reverse currents require higher voltages on the diode and therefore limit the switching element voltage to about one or two volts. Hence simultaneous high reverse current and voltage on the switching element is avoided and the carbon storage element 1920 can avoid a RESET immediately after a SET (i.e., it is believed that the newly formed linkages or filaments formed in the carbon material are not broken or destroyed during the SET operation). Advantageously, the steady current during a reverse bias SET eliminates chatter and reduces the SET time. In addition, the steady current during a reverse bias SET results in consistent read currents of memory cells in the SET state. In contrast, the during RESET operation about one or two volts of forward bias across the diode allow about 10 micro Amps or more to flow thru the cell. The rest (about 3 or 4 Volts) of the reset voltage is applied to the switching element. This larger forward bias applied to the switching element, and higher current through the carbon material is believed to break or destroy the linkages or filaments in the carbon material to increase the resistivity of the carbon material.

Reverse Bias by Capacitive Discharge of the Bit and Word Lines

Figure 22:
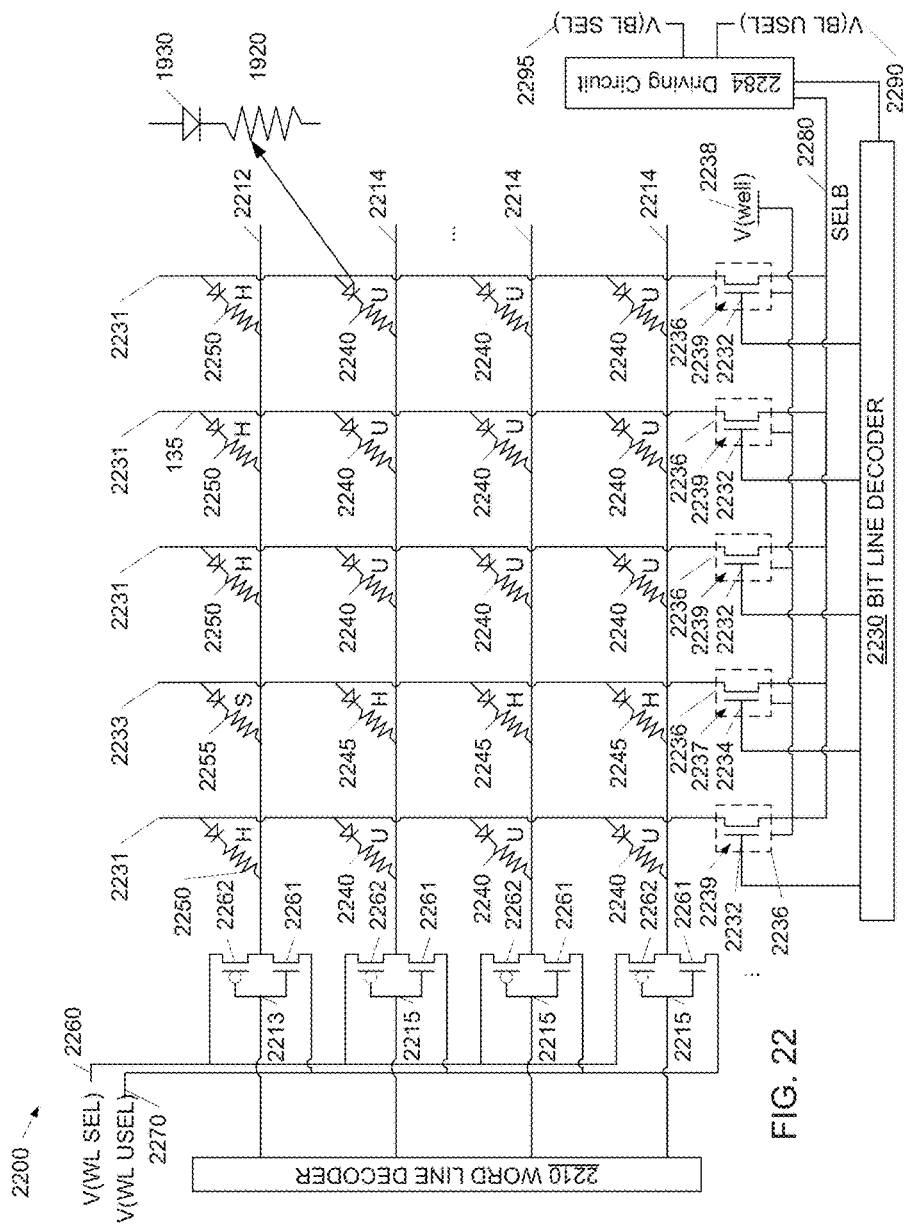
FIG. 22 is a circuit diagram of a memory cell array in accordance with a representative embodiment.

Referring to FIG. 22, a circuit diagram of a memory cell array in accordance with a representative embodiment is shown. The memory cell array 2200 includes a word line (i.e., row) decoder 2210, a bit line (i.e., column) decoder 2230, word lines 2212 and 2214, bit lines 2231 and 2233, and memory cells 2240, 2245, 2250, and 2255. Each of the memory cells 2240, 2245, 2250, and 2255 is connected to one bit line (for instance, memory cell 2255 is connected to bit line 2233) and one word line (for instance, memory cell 2255 is connected to word line 2212). Each of the memory cells 2240, 2245, 2250, and 2255 include a diode steering element 1930 and a carbon storage element 1920.

The word line decoder 2210 controls dual device drivers 2213 and 2215. Alternatively, other word line device drivers can be used. Each of the dual device drivers 2213 and 2215 drives one of the word lines 2212 and 2214, respectively. Each of the dual device drivers 2213 and 2215 includes a PMOS transistor 2262 and a NMOS transistor 2261. In this example, the NMOS transistor 2261 is connected (e.g., the source region of the NMOS is connected) to a word line unselect voltage source 2270 (V(WL VSEL)). The word line unselect voltage source 2270 provides a word line unselect voltage, such as 0V or ground. The word line unselect voltage source can change based on the operation performed on a memory cell. The PMOS transistor 2262 is connected (e.g., the source region of the PMOS is connected) to a word line select voltage source 2260 (V(WL SEL)). During a SET operation, the word line select voltage source 2260 provides a voltage of half of the SET voltage, positively biased (+½ Vset). The SET voltage can be the voltage needed to lower the resistivity of a carbon storage element, as described above. The word line select voltage source can change based on the operation performed on a memory cell, for instance, during a read, the word line select voltage source can be ground.

Various relative voltages can be chosen for the word line select and unselect voltage sources to control the amount of leakage through the memory cells. Generally, the biasing voltages can be adjusted to account for the turn-on voltages of the memory cells. In FIG. 22, when the word line decoder 2210 applies an unselect control voltage to the dual device drivers (2213, 2215), the NMOS transistor 2261 is activated and applies (e.g., via the NMOS drain) the word line unselect voltage to the word lines (2212, 2214); the PMOS transistor 2262 is deactivated. Conversely, the when the word line decoder 2210 applies a select control voltage to the dual device drivers (2213, 2215), the PMOS transistor 2262 is activated and applies the word line select voltage to the word lines (2212, 2214) via its drain; the NMOS transistor 2261 is deactivated.

The bit line decoder 2230 controls single device drivers 2237 and 2239. Each of the single device drivers 2237 and 2239 drives one of the bit lines 2233 and 2231, respectively. Each of the single device drivers 2237 and 2239 includes a MOSFET transistor (2234, 2232). The MOSFET transistor (2232, 2234) can be a NMOS or PMOS transistor. The MOSFET transistors (2232, 2234) can each be isolated using a triple well 2236. For example, by placing the NMOS transistor in a p-well (where the p-well is in an n-well that is in a p-substrate), negative voltages can be used. The use of negative voltages allows all unselect bias voltages to be ground voltage in the reverse bias set operation, and many voltages on chip can be reduced by ½ VPP (where VPP is the maximum voltage applied to the memory cells). The use of negative voltages also allows a reduction in the maximum stress applied to any MOSFET driver device to about ½ VPP. This arrangement saves power and causes less stress on the circuit. The triple well 2236 is biased by a well voltage 2238. The well voltage 2238 is the most negative bias for the NMOS driver circuit.

Each of the single device drivers 2237 and 2239 can be connected to a driving circuit 2284 by data bus 2280 (SELB). The driving circuit 2284 can be connected to a bit line select voltage source 2295 (V(BL SEL)) and a bit line unselect voltage source 2290 ("V(BL UNSEL)"). The bit line select voltage source 2295 is equal to about of half of the SET voltage, negatively biased (−½ Vset). The bit line unselect voltage source 2290 provides a bit line unselect voltage, such as 0V or ground. The bit line select voltage source can change based on the operation performed on a memory cell, for instance, during a read, the bit line select voltage source can be VPP. Various relative voltages can be chosen for the bit line select and unselect voltage sources to control the amount of leakage through the memory cells. Generally, the biasing voltages can be adjusted to account for the turn-on voltages of the memory cells.

Alternatively, the orientation of the memory cells 2240, 2245, 2250, and 2255 can be reversed so their "anodes" and "cathodes" are interchanged. The PMOS transistors are replaced with NMOS transistors and vice-versa. Hence, the select and unselect voltages are reversed in polarity. Alternatively, the single device drivers and the dual device drivers can optionally include pull-up or pull-down resistors. In other embodiments the bit line driver is implemented by a two device driver including one NMOS device and one PMOS device.

Figure 23:
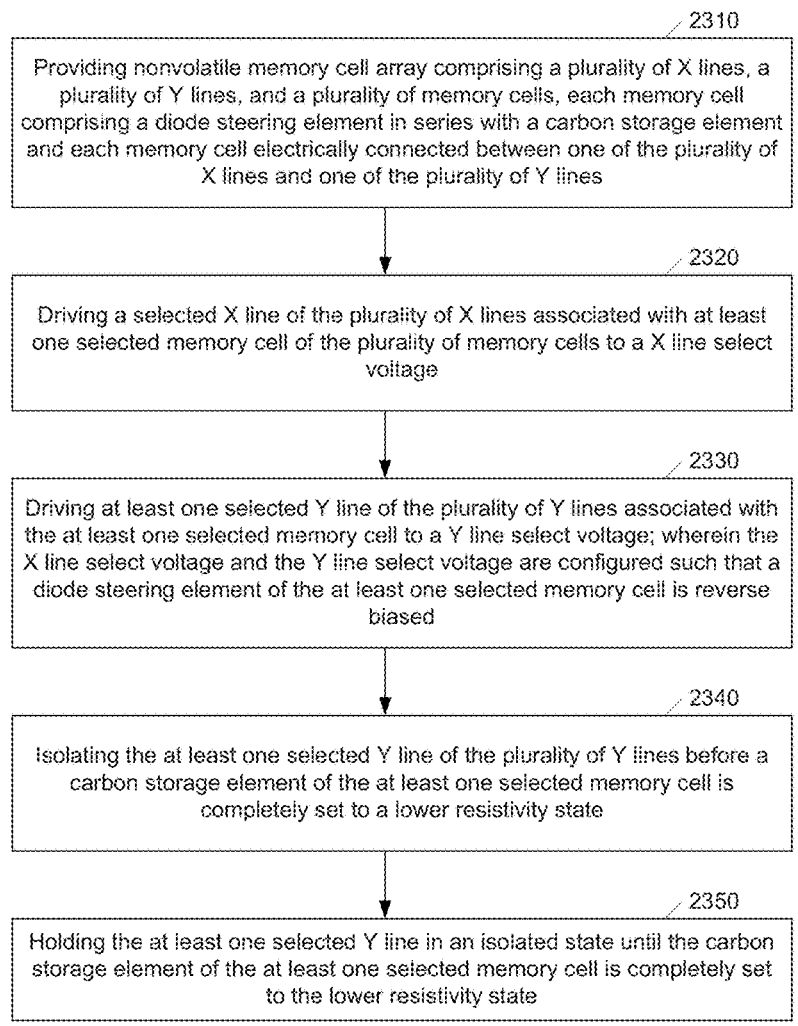
FIG. 23 is a flowchart of programming the memory cell array of FIG. 22 in accordance with a representative embodiment.

Referring to FIG. 23, a flowchart of programming the memory cell array 2200 of FIG. 22 in accordance with a representative embodiment is shown. Additional, fewer, or different operations may be performed depending on the particular embodiment. The operations may also be performed in a different order than that shown and described. In an operation 2310, a memory cell array including a plurality of X lines (e.g., word lines), a plurality of Y lines (e.g., bit lines), and a plurality of memory cells is provided. Each memory cell includes a diode steering element in series with a carbon storage element and each memory cell can be electrically connected between one of the plurality of X lines and one of the plurality of Y lines. For example, the memory cell array can be the memory cell array 2200 of FIG. 22. In one example the charging bit line bias is minus one half the Vset, and the word line bias is plus half the Vset. The anode of the memory cell is connected to the bit line and the cathode to the word line.

In an operation 2320, a selected X line of the plurality of X lines associated with at least one selected memory cell of the plurality of memory cells is driven to a X line select voltage.

For example, selected word line 2212 is driven to the word line select voltage, +½ Vset. The pulse duration may be hundreds of nano seconds to hundreds of micro seconds so the word line bias is applied before during and after the bit line pulse is applied. The remaining unselected word lines 2214 are driven to the word line unselect voltage, for example, ground. In another embodiment, the word line pulse is short (about 10 to 100 ns) and the bit line pulse is longer.

In an operation 2330, at least one selected Y line of the plurality of Y lines associated with the at least one selected memory cell 2255 is driven to a Y line select voltage. The pulse duration may be 10 to 100 ns. The X line select voltage and the Y line select voltage are configured such that a diode steering element of the at least one selected memory cell is reverse biased. For example, the selected bit line 2233 is driven to the bit line select voltage, −½ Vset. The remaining unselected bit lines 2231 are driven to the bit line unselect voltage, for example, ground. While bit line 2233 and word line 2212 are being driven, a charge is building across bit line 2233 and word line 2212. Alternatively, many bit lines can be selected at the same time.

Thus, memory cell 2255 is now selected, indicated by 'S'. The diode of Memory cell 2255 is reverse biased at the setting voltage. Memory cells 2250 are now half-selected, indicated by 'H'. The diodes of memory cells 2250 are slightly reversed biased, but not enough to conduct a significant amount of current. Memory cells 2245 are now half-selected, indicated by 'H'. The diodes of memory cells 2245 are slightly reverse biased, but not enough to conduct a significant amount of current. Therefore, the half selected memory cells (2250, 2245) will not conduct enough current to SET or reset. Memory cells 2240 are now unselected indicated by 'U'. Memory cells 2240 are not biased and will not conduct current.

In an operation 2340, the at least one selected Y line of the plurality of Y lines is isolated before a carbon storage element of the at least one selected memory cell is completely SET to a lower resistivity state (i.e., before reaching a predetermined resistivity state when all of the linkages or filaments in the carbon material needed to reach this predetermined resistivity state are formed). The isolation duration may be 10 ns to several microseconds (e.g., 10 ns to 10 microseconds). For example, MOSFET transistor 2234 of the single device driver 2237, which is connected to bit line 2233, can be turned off. The bit line 2233 can now be floating relative to the driving circuit 2284. When the MOSFET transistor 2234 is turned off, the charge that has built across bit line 2233 and word line 2212 still remains on bit line 2233. However, the carbon storage element 1920 of memory cell 2255 has not completely SET yet. That is, the carbon storage element 1920 of memory cell 2255 has not reached the lower resistivity state associated with the SET state. Notably, the plate area of a bit line is large relative to the cross-section of a diode steering element.

In an operation 2350, the at least one selected Y line is held in an isolated state until the carbon storage element of the at least one selected memory cell is completely SET to the lower resistivity state. For example, the charge that has built across bit line 2233 and word line 2212 can still provide current to the carbon storage element 1920 of memory cell 2255. Eventually, the charge will cause the carbon storage element 1920 to set, or completely change to a lower resistivity state (e.g., when all of the desired linkages or filaments in the carbon material are formed). After the storage element is completely SET, the isolation of the selected bit line can be stopped and the next operation (e.g., a read or programming operation) can be performed by applying a bias to the bit line. Advantageously, the capacitive discharge of bit line 2233 produces a limited amount of current determined by bit line and world line capacitance and the cell resistance which protects the diode from damage during the SET process. Advantageously, chatter or the possibility of RESET after SET is greatly reduced because the voltage decrease across the cell is synchronized with the SET of the cell. It should be noted that an isolated bit line includes the case where a negligible (up to 100 nA) current flows to the bit line during the SET operation. For some large arrays it is possible that tens of nano amps of current may flow to the bit line, regardless of whether it is intended or not. Even deliberate 50 to 100 nAmp currents would not avoid the above described capacitive set operation.

In the case where more than one bit line is selected and charged, the selected bit lines are all isolated quickly, but the selected cells may SET at various time (e.g., by design or due to variability in the carbon material). As selected cells become set, each associated bit line charges to reduce the voltage across the cell and remain set. The voltage drop in the word line decreases as more selected cells SET and more bit lines discharge providing better word line voltage for the remaining or harder to SET bits. In alternative embodiments, the biasing voltage between a bit line and a word line can have various configurations including splitting the biasing voltage 100/0, 50/50, 25/75, 75/25, 0/100, etc. where, for example 0 denotes ground (or 0 V) and 100 denotes the full magnitude of the biasing voltage.

Figure 24:
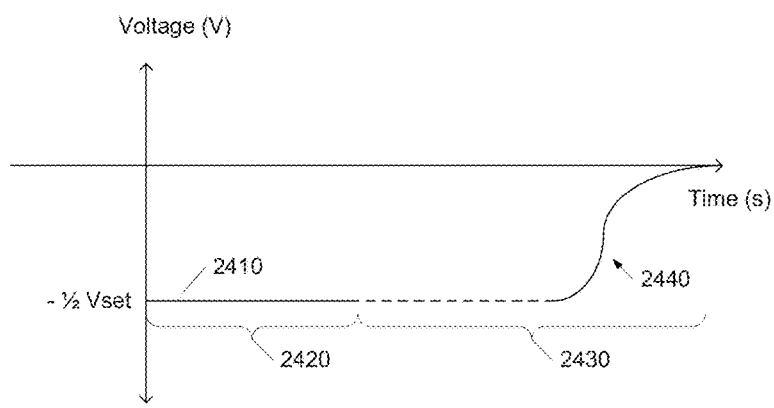
FIG. 24 is a graph of a bit line voltage versus time in accordance with a representative embodiment.

Referring to FIG. 24, a graph of a bit line voltage in accordance with a representative embodiment is shown. The graph shows the voltage (V) versus time (sec) on a selected bit line, for example, selected bit line 2233. Plot 2410 shows the voltage changes that occur on selected bit line 2233 during the operations of FIG. 23. In region 2420, bit line 2233 is driven to the bit line select voltage, −½ Vset, thereby reverse biasing the diode steering element 1930 of memory cell 2255. In region 2430, bit line 2233 is isolated or floated leaving a charge on bit line 2233. In region 2440, the carbon storage element 1920 of memory cell 2255 sets, changing to a lower resistivity. The charge on bit line 2233 is partially consumed by the state change of the carbon storage element 1920. The remaining charge on bit line 2233 can be drained to the word line 2212 as the carbon storage element 1920 becomes more conductive. The carbon storage element 1920 sets during the wait time and the bias across the cell drops. In typical bias cases, the bit line voltage rises (absolutely) closer to the word line bias.

Advantageously, since the current is bounded by the charge available from the isolated bit line, the carbon storage element 1920 can avoid a RESET immediately after a SET by limiting surge current. Advantageously, the steady current during a reverse bias SET reduces or eliminates chatter and reduces the SET time. In addition, the steady current during a reverse bias SET results in consistent read currents of memory cells in the SET state.

Reverse Bias by Capacitive Discharge Circuit

Rather than isolating just the bit line, the data bus connected to the bit line can be isolated from driving circuitry but still connected to the selected cell so a large capacitance is discharged through the cell in the SET process. Various circuits for controlling the capacitive discharge can be used. For example, the capacitive discharge circuits disclosed in U.S. patent application Ser. No. 12/339,338, filed Dec. 19, 2008, entitled "Capacitive Discharge Method for Writing to an NVM" which has been incorporated by reference, can be used. These circuits can be modified for reverse biasing by forming the electronic dual of the circuitry, i.e. where all NMOS devices are changed to PMOS and biases change polarity. Alternatively the cell could be inverted such that the anode is connected to the word line and the cathode is connected to the bit line. The biasing voltage between a bit line and a word line can have various configurations including splitting the biasing voltage 100/0, 50/50, 25/75, 75/25, 0/100, etc. where, for example 0 denotes ground (or 0 V) and 100 denotes the full magnitude of the biasing voltage.

Figure 25:
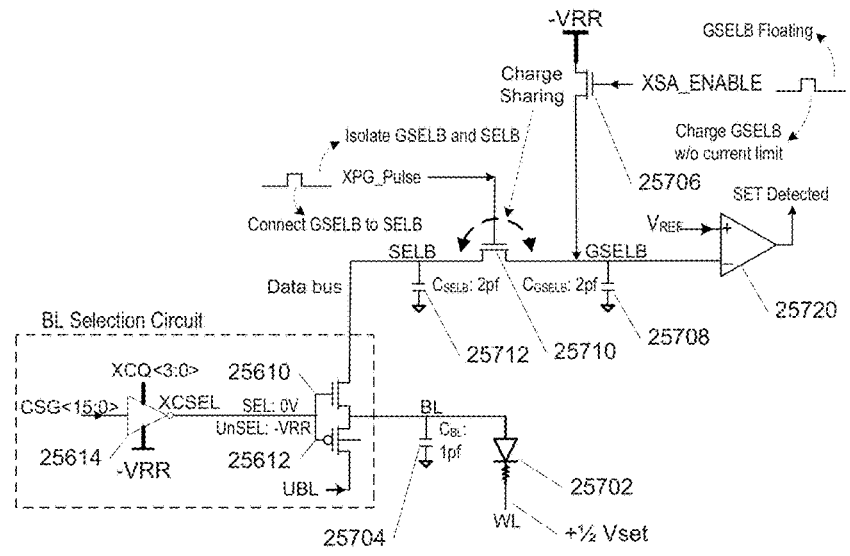
FIG. 25 is a schematic diagram of a capacitive discharge circuit in accordance with a representative embodiment.

Referring to FIG. 25, a schematic diagram of a capacitive discharge circuit in accordance with a representative embodiment is shown. In some embodiments, there will be one such circuit for each bit line or a group of such circuits that can be selectively connected to different groups of bit lines.

In some embodiments, it is desirable to select the word line first because in some monolithic three dimensional memory arrays the word line selection is slow. The charge may be placed on the bit line capacitance very quickly by charge sharing as illustrated in FIG. 25. An additional capacitor 25708 is charged to the highest voltage (relatively) available in the circuitry during a pre-charge time. Then, the bit line is selected through driver device 25610 and a charge sharing device 25710 is turned on to connect this capacitor to the Data Bus (SELB) and the bit line (BL). The connected capacitors (25708, 25712, 25704) quickly reach a desired voltage for the SET operation determined by the capacitance ratio, and then the charge sharing device is shut off. The SET operation occurs after the bit line receives the charge transfer because it takes a longer time to SET the reversible resistance-switching element than to transfer the charge.

The circuit of FIG. 25 includes a memory cell 25702 that includes a carbon storage element and a diode, as described above with respect to FIG. 19. Memory cell 25702 is connected to a bit line BL having a capacitance 25704. In one embodiment, capacitance 25704 is 1 pf. The bit line BL is connected to a Data bus via the BL Selection Circuit. In one embodiment, each bit line has its own BL driver devices (25610, 25612), many bit lines can share other portions of the selection circuitry represented by symbol 25614, and many bit lines can be connected to a multi-line Data Bus.

The Data bus is connected to the bit line via transistor 25610. The Data bus, which comprises capacitance 25712 (e.g. 2 pf), is connected to transistor 25710 which controls the charge sharing. The gate of transistor 25710 receives a pulse (XPG_PULSE). Between pulses, the Data bus (node SELB) is floating and isolated from node GSELB. During the pulse (a positive pulse), the data bus (node SELB) is connected to GSELB. Capacitor 25708 (e.g. 2 pf) is connected to ground from GSELB.

Transistor 25706, which is connected to −VRR and to GSELB, receives a pulse (XSA_ENABLE). Between pulses, GSELB is floating. During a positive pulse, −VRR is used to charge GSELB without a current limit. −VRR is slightly greater in magnitude than −½Vset. VRR is the most negative voltage for the bit line driver and the decoder circuitry. When transistor 25710 receives a pulse at its gate, the charge at GSELB is used to charge SELB and the bit line to (−VRR)× (Capacitance of Data bus)/(Capacitance of Data bus+Capacitance of GSELB+Capacitance of BL). The charge from GLELB transferred to the bit line charges the bit line to the desired −½Vset.

The circuit of FIG. 25 also includes a comparator 25720 which compares the voltage at GSELB with a reference Vref. When the comparator senses the discharge of the data bus and bit line, it concludes that a SET has successfully occurred and outputs a SET detection signal indicating that the memory cell has been SET. The output of comparator 25720 is provided to the control logic for the memory system.

Figure 26:
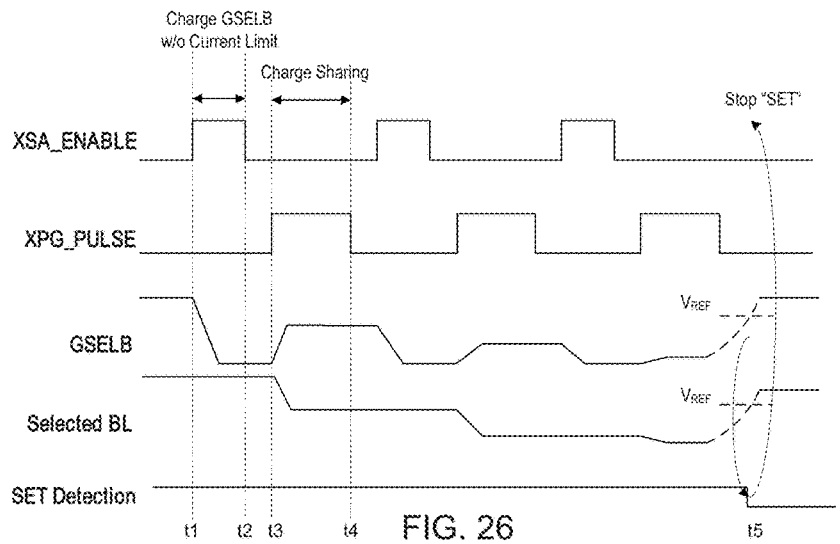
FIG. 26 is a timing diagram that explains various embodiments for operating the circuit of FIG. 25 in accordance with a representative embodiment.

Referring to FIG. 26, a timing diagram that explains various embodiments for operating the circuit of FIG. 25 in accordance with a representative embodiment is shown. Between t1 and t2, a pulse is applied to transistor 25706 by the signal XSA_ENABLE. This charges GSELB without a current limit, as depicted. Between t3 and t4, a pulse is applied to transistor 25710 by the signal XPG_PULSE. This cause the charge to be shared with SELB. The BL Selection circuit allows that charge to be shared with the bit line, as depicted in FIG. 26. In some cases, this one iteration will cause the memory cell to be SET. In other embodiments, multiple iterations of the two pulses (charging GSELB and charge sharing) will be used to increase the charge on the bit line until the memory cell is SET (see t5).

Figure 27:
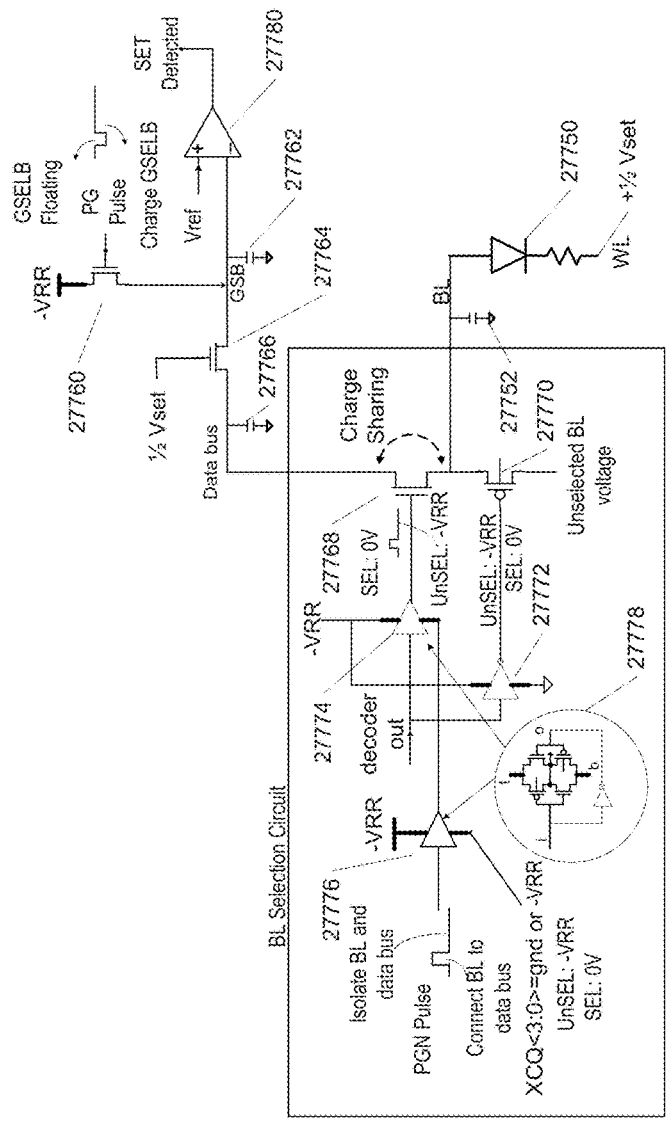
FIG. 27 is a schematic diagram of another embodiment of a circuit that can be used to set a memory cell using the capacitive discharge in accordance with a representative embodiment.

Referring to FIG. 27, a schematic diagram of another embodiment of a circuit that can be used to SET a memory cell using the capacitive discharge described above in accordance with a representative embodiment is shown. In some embodiments, there will be one such circuit for each bit line or a group of such circuits that can be selectively connected to different groups of bit lines. In the circuit of FIG. 27, the bit line selection device is turned off before the memory cell is switched into the new state.

The circuit of FIG. 27 includes a memory cell 27750 that includes a carbon storage element and a diode, as described above with respect to FIG. 19. Memory cell 27750 is connected to a bit line BL having a capacitance 27752. The bit line BL is connected to a Data bus via the BL Selection Circuit. In one embodiment, each bit line has its own BL selection circuit, and many bit lines can be connected to a multi-line Data bus.

The Data bus, which includes a capacitance 27766, is connected to node GSB via transistor 27764, which has its gate connected to ½ Vset. Node GSB is connected to comparator 27780, which operates like comparator 27720 of FIG. 25. The output of comparator 27780 is provided to the control logic for the memory system. Transistor 27760, which is connected to −VRR and to GSB, receives a pulse (PG Pulse). During a pulse, GSB is floating. Between pulses, −VRR is used to charge GSB, which charges the Data bus. Based on the selection signals XCQ<3:0> and "decoder out" the BL Selection Circuit shares the charge on the data bus with the selected bit line in order to SET memory cell 27750 as discussed above.

The BL Selection Circuit of FIG. 27 includes transistor 27768, transistor 27770, inverter 27772, pass gate 27774 and pass gate 27776. Circle 27778 provides the details (four internal transistors and inverter) of pass gates 27774 and 27776. The pass gates have an input (i), inverted output (o), output (shown by an arrow), top node (t) and bottom node (b). If the input (i) is a positive voltage, the output receives the signal from the bottom node (b). If the input (i) is a negative or zero voltage, the output receives the signal from the top node (t). Pass gate 27776 receives PGN Pulse which is the inversion of the pulse received by transistor 27760. During a pulse (positive voltage), the appropriate one of XCQ<3:0>, which is input at the bottom node of pass gate 27776, is provided at the output of pass gate 27776 and transferred to the output of pass gate 27774 if "decoder out" is also selecting the bit line with a positive voltage. The appropriate one of XCQ<3:0> will be at 0V for the selected bit line and at −VRR for the unselected bit line. When the gate of transistor 27768 receives −VRR, it cuts off the bit line from the Data bus. When the gate of transistor 27768 receives 0V, it shares the charge on the Data bus with the bit line. Note that the gate voltage (0V) of transistor 27768 can be set to control the transient current by trim-options.

Between pulses input to pass gate 27776, −VRR will be transferred to the output of pass gate 27776 and to the output of pass gate 27774, which is then provided to the gate of transistor 27768 to cut off the bit line from the Data bus. If XCQ<3:0> or "decoder out" is also selecting the bit line, then −VRR will be passed to the gate of transistor 27768 to cut off the bit line from the Data bus.

Figure 28:
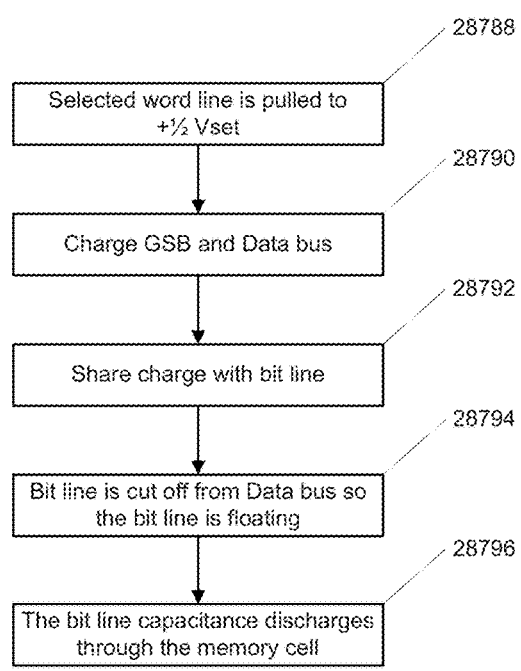
FIG. 28 is a flow chart describing the operation of the circuit of FIG. 27 in accordance with a representative embodiment.

Referring to FIG. 28, a flow chart describing the operation of the circuit of FIG. 27 in accordance with a representative embodiment is shown. In step 28788, the selected word line is driven to ½ Vset. In step 28790, node GSB and the data bus are charged, as explained above by transferring −VRR to node GSB between pulses of PG Pulses. −VRR is higher in magnitude than the desired bit line voltage −½ Vset by a capacitive charge sharing ratio. In step 28792, the charge on the data bus is shared with the bit line by connecting the bit line to the data bus using the BL Selection circuit, as described above. In step 28794, the bit line is cut off from the data bus, thereby floating the bit line. As a result, the bit line discharges through memory cell 27750 in step 28796. In some embodiments, one iteration of the process of FIG. 28 is enough to SET the memory cell. In other embodiments, multiple iterations are needed to SET the memory cell. Advantageously, the circuits of FIGS. 25 and 27 limit the amount of electrical charge in the SET operation rather then the SET current.

Temperature Control of Biasing Voltage

Figure 29:
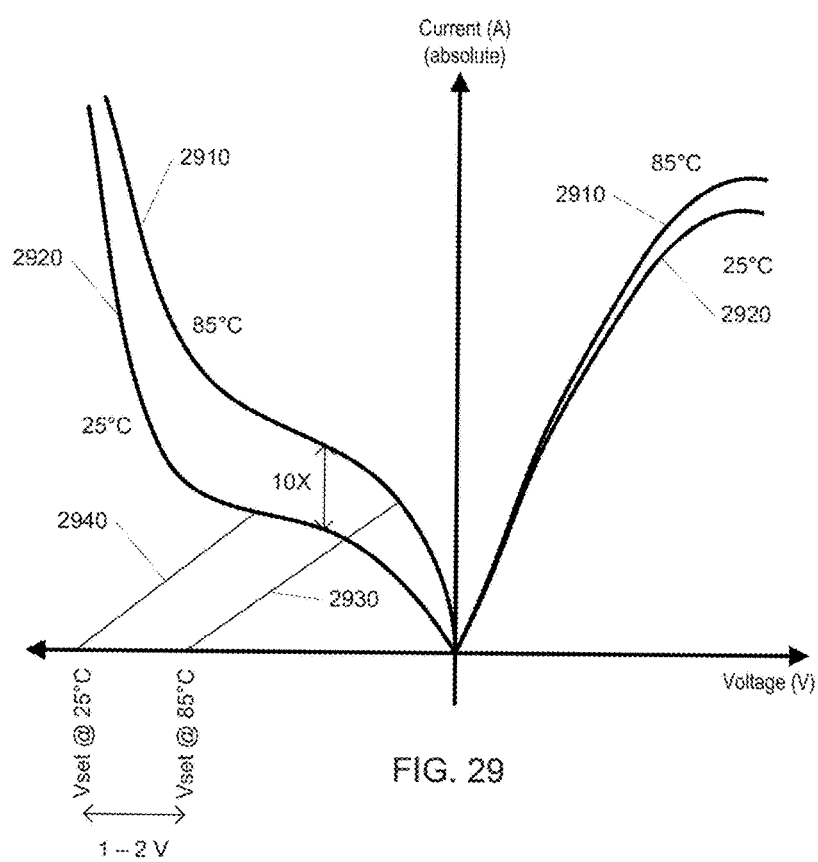
FIG. 29 is a current-voltage graph of a diode of a memory cell at various temperatures in accordance with a representative embodiment.

Referring to FIG. 29, a current-voltage (I-V) graph of a diode of a memory cell at various temperatures in accordance with a representative embodiment is shown. The graph shows the absolute current (A) versus voltage (V) for a diode of a memory cell in a memory array. Plot 2910 shows the current of the diode in reverse bias and in forward bias at 85 degrees Celsius. Plot 2920 shows the current of the diode in reverse bias and in forward bias at 25 degrees Celsius. Plot 2930 shows the load line for a carbon storage element in an OFF state at 85 degrees Celsius, where the reverse bias setting mode is going to be used. Plot 2940 shows the load line for a carbon storage element in an OFF state at 25 degrees Celsius, where the reverse bias setting mode is going to be used.

The reverse SET method for a resistivity switching element can include a temperature sensing circuit, on chip, which is used to control the Vset bias level such that a higher bias is applied at colder temperatures than at higher temperatures. As illustrated by plots 2910 and 2920 the current level flowing through the cell as SET starts, in reverse bias, is more consistent from the cold temperature operation to the high temperature operation. The diode current changes about 10 times and Vset changes about 1 to 2 volts for an about 60 degree temperature difference. Thus, the setting voltage selected based on the sensed temperature comprises increasing a magnitude of the setting voltage in a range of about 1 volt to 2 volts when the sensed temperature decreases, relatively, about 55 to 65 degrees Celsius. Both −½ Vset and +½ Vset can be varied if the bias is split as in FIG. 22. In addition, the SET voltage can also be adjusted for sets and resets where a forward bias is used (i.e., the SET operation may be conducted with forward or reverse bias, and the RESET operation may be conducted with forward or reverse bias) and where the storage element is any kind of resistivity storage element (e.g., an antifuse dielectric, a fuse, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material). Various control circuits and methods can be used to adjust Vset based on the temperature sensed. Advantageously, the biasing voltage, in particular a setting voltage, can be controlled precisely under varying temperature conditions.

Figure 30:
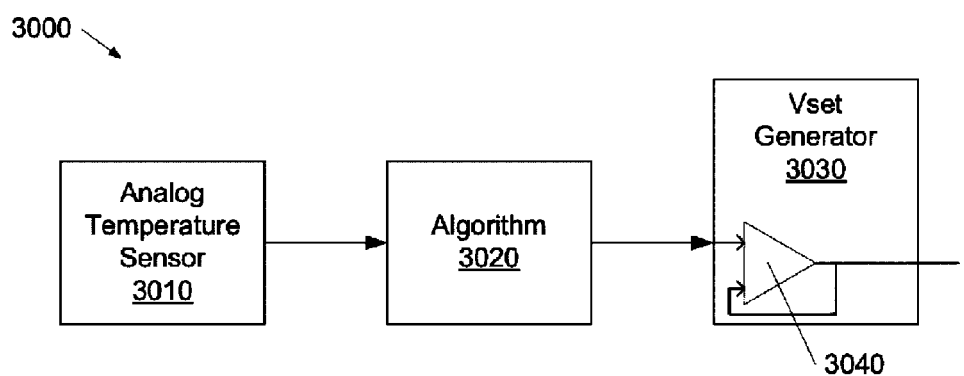
FIG. 30 is a circuit of a temperature-based algorithmic bias selector in accordance with a representative embodiment.

Referring to FIG. 30, a circuit of a temperature-based algorithmic bias selector in accordance with a representative embodiment is shown. A selector circuit 3000 includes an analog temperature sensor 3010, an algorithm storage/processing module 3020, and a Vset generator 3030. The analog temperature sensor 3010 senses a temperature of at least one memory cell or a temperature of a chip which includes the at least one memory cell. The at least one memory cell comprises a steering element and a storage element. The analog temperature sensor 3010 can be located on the same die as the at least one memory cell or the analog temperature sensor 3010 can be, for example, integrated into the same packaging, assembly, or device as the at least one memory cell. The analog temperature sensor 3010 provides a temperature signal to algorithm module 3020.

Algorithm module 3020 selects a setting voltage based on the sensed temperature represented by the temperature signal. The algorithm module 3020 includes a temperature-setting voltage model such as in FIG. 29. For example, the algorithm module 3020 includes a stored value slope of a plot Vset variation as a function temperature. Alternatively, more sophisticated temperature-setting voltage models can be used. The algorithm module 3020 provides a Vset reference to the Vset generator 3030. The Vset reference can be analog or digital.

The Vset generator 3030 provides the setting voltage to the at least one memory cell. In one embodiment, the steering element is reverse biased and the storage element is SET to a lower resistivity state. Vset generator 3030 can include a comparator 3040. The comparator 3040 compares the Vset reference to the setting voltage and adjusts the setting voltage accordingly.

Figure 31:
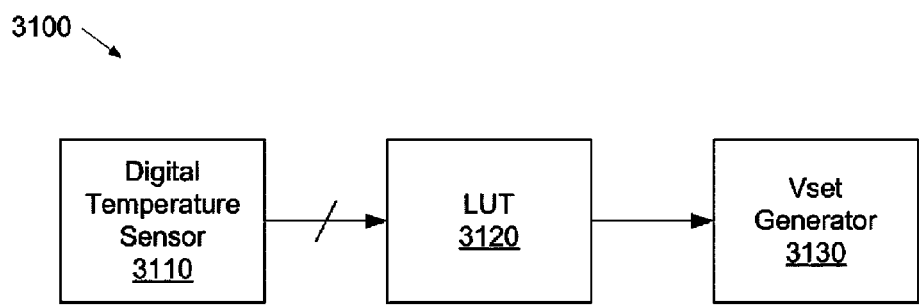
FIG. 31 is a circuit of a temperature-based look-up bias selector in accordance with a representative embodiment.

Referring to FIG. 31, a circuit of a temperature-based look-up bias selector in accordance with an alternative representative embodiment is shown. A selector circuit 3100 includes a digital temperature sensor 3110, a look-up table (LUT) module 3120, and a Vset generator 3130. The digital temperature sensor 3110 senses a temperature of at least one memory cell or a chip comprising the at least one memory cell. The at least one memory cell comprises a steering element and a storage element. The digital temperature sensor 3110 can be located on the same die as the at least one memory cell or the digital temperature sensor 3110 can be, for example, integrated into the same packaging, assembly, or device as the at least one memory cell. The digital temperature sensor 3110 provides a digital temperature signal to look-up table module 3120.

Look-up table module 3120 selects a setting voltage based on the sensed temperature represented by the temperature signal. The look-up table module 3120 includes a stored data table with setting voltages for various temperatures, such as a data table based on a plot shown in FIG. 29. For example, the look-up table module 3120 includes a first Vset reference for a memory cell at 85 degrees Celsius and a second Vset reference for a memory cell at 25 degrees Celsius. In addition, the look-up table module 3120 can include tables for various diodes and storage element types. The look-up table module 3120 provides a Vset reference to the Vset generator 3130. The Vset reference can be analog or digital.

The Vset generator 3130 provides the setting voltage to the at least one memory cell. In one embodiment, the steering element is reverse biased and the storage element is SET to a lower resistivity state. Vset generator 3130 can compare the Vset reference to the setting voltage and adjust the setting voltage accordingly. Thus, in the embodiments of FIGS. 30 and 31, the setting voltage selected based on the sensed temperature includes calculating the setting voltage based on an algorithm which is a function the sensed temperature or matching the sensed temperature to a setting voltage value in a look-up table.

The foregoing description of the exemplary embodiments have been presented for purposes of illustration and of description. It is not intended to be exhaustive or to limit the invention to the precise form disclosed, and modifications and variations are possible in light of the above teachings or may be acquired from practice of the invention. For example, the described exemplary embodiments focused on one layer of memory cells. The present invention, however, is not limited to one layer. Those skilled in the art will recognize that the device and methods of the present invention may be practiced using multiple levels of memory cells that are mirrored, half mirrored, or have separate X-line and Y line layers as is well known in the art of three dimensional memory arrays. In a half mirrored arrangement the Y-line is shared between two levels of memory cells. The Y-line has diode layers both above and below. Additionally, types of diodes and resistivity switching materials may be changed without deviating from the spirit of the invention. Similarly, various types and numbers of diodes may be employed such as distributed diodes. Likewise, the device and methods of the present invention may be practiced using other passive element memory systems. Consequently, a wide variety of current-voltage profiles are possible. Hence, a switching point voltage range of −5V to −15 is not limiting. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

While the invention has been largely described with respect to the embodiments set forth above, the invention is not necessarily limited to these embodiments. For example, the instant invention can also be applied to three-dimensional memory arrays configured as a plurality of levels, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; The memory described in "Three-Dimensional Memory Array Incorporating Serial Chain Diode Stack" by Kleveland, et al, U.S. patent application Ser. No. 09/897,705, filed on Jun. 29, 2001; the memory described in "Word Line Arrangement Having Multi-Layer Word Line Segments for Three-Dimensional Memory Array," referenced above; and the memory described in U.S. patent application Ser. No. 10/185,508 by Cleeves, filed Jun. 27, 2002, entitled "Three Dimensional Memory", each of which is hereby incorporated by reference.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array. The memory cell may incorporate a reprogrammable memory material for which the conductivity may decrease or increase after application of a suitable electrical pulse.

Such passive element memory cells may generally be viewed as having a current steering element directing current in a direction and another component which is capable of changing its state (e.g., a fuse, an antifuse, a capacitor, a resistive element, etc.). In certain preferred embodiments of the present invention, the memory element is a diode-like structure having a p+ region separated from an n− region by an antifuse element. When the antifuse element is programmed, the p+ region is electrically connected to the n− region and forms a diode. The programming state of the memory element can be read by sensing current flow or voltage drop when the memory element is selected. In an organic PEMA embodiment, the memory element is a diode-like structure having an anode region separated from a cathode region by an organic material layer whose conductivity changes as electrons are injected into the layer.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference. Memory cells comprising resistance change materials including transition metal oxides, as described in more detail in U.S. patent application Ser. No. 11/287,452 by Herner, et al. which is hereby incorporated by reference, carbon nanotube layers, which may be formed as described in US Patent Pub 20050269553 Sen, Rahul, et al. which is hereby incorporated by reference, and amorphous, polycrystalline or microcrystalline carbon layers can also be used.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. Pat. No. 6,618,295, entitled "Method and Apparatus for Biasing Selected and Unselected Array Lines When Writing a Memory Array", by Roy E. Scheuerlein, filed on Jun. 29, 2001, and in "Three-Dimensional Memory Array Incorporating Serial Chain Diode Stack" by Kleveland, et al, U.S. patent application Ser. No. 09/897,705, filed on Jun. 29, 2001, which are both hereby incorporated by reference in their entirety.

In the above description, an array line is generally shared by two levels of the memory array (i.e., memory planes). Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines (e.g., which may be shown horizontally) and Y-lines (e.g., which may be shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of given word. Such various array organizations and configurations are well known in the art, and the invention in intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (i.e., multi-level) memory array, an adjacent memory plane may be connected similarly (e.g., a back-to-back diode stack memory array as described in U.S. Pat. No. 6,034,882 to Johnson, et al., referred to above) so that the anode terminals are connected to bit lines and the cathode terminals to word lines, or may reverse the directionality of memory cells in the adjacent plane (e.g., a serial chain diode stack memory array as described in U.S. patent application Ser. No. 09/897,705 by Kleveland, et al., referred to above). Consequently, the designations herein of X-lines, word lines, and row lines, and of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as subarrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. All patents and patent applications mentioned herein are incorporated by reference in their entirety.

What is claimed is:

1. A method of programming a nonvolatile memory cell comprising a diode steering element in series with a carbon storage element, the method comprising:
   providing a first voltage to the nonvolatile memory cell, such that the diode steering element is reverse biased and the carbon storage element is set to a lower resistivity state,
   wherein the carbon storage element comprises a polycrystalline carbon resistivity switching material.

2. The method of claim 1, further comprising:
   providing a second voltage to the nonvolatile memory cell, such that the diode steering element is forward biased and the carbon storage element is reset to a higher resistivity state.

3. The method of claim 2, wherein a magnitude of a second current associated with the second voltage is greater than a magnitude of a first current associated with the first voltage and the carbon storage element is set and reset a plurality of times.

4. The method of claim 1, wherein providing the first voltage to the nonvolatile memory cell comprises providing a voltage pulse to the nonvolatile memory cell.

5. The method of claim 1, wherein providing the first voltage to the nonvolatile memory cell comprises at least one of charging a bit line associated with the nonvolatile memory cell or discharging a capacitive storage element across the memory cell wherein the capacitive storage element comprises a capacitor driving the bit line associated with the nonvolatile memory cell.

6. The method of claim 1, wherein:
the diode steering element comprises a p-n semiconductor diode, a p-i-n semiconductor diode, or a punch-through diode.

7. The method of claim 1, wherein:
the carbon storage element and the diode steering element comprise a pillar shaped cell located over a lower electrode and under an upper electrode; and
the diode steering element is located over or under the carbon storage element.

8. The method of claim 2, wherein:
when the carbon storage element is set to the lower resistivity state, conductive linkages are formed between portions of a carbon material of the carbon storage element; and
when the carbon storage element is reset to the higher resistivity state, conductive linkages are broken between the portions of the carbon material of the carbon storage element.

9. The method of claim 1, further comprising: programming a nonvolatile memory cell array, the nonvolatile memory cell array comprising a plurality of X lines, a plurality of Y lines, and a plurality of memory cells, each memory cell comprising the diode steering element in series with the carbon storage element and each memory cell electrically connected between one of the plurality of X lines and one of the plurality of Y lines, wherein providing the first voltage comprises:
driving a selected X line of the plurality of X lines associated with at least one selected memory cell of the plurality of memory cells to a X line select voltage;
driving at least one selected Y line of the plurality of Y lines associated with the at least one selected memory cell to a Y line select voltage; wherein the X line select voltage and the Y line select voltage are configured such that the diode steering element of the at least one selected memory cell is reverse biased;
isolating the at least one selected Y line of the plurality of Y lines before the carbon storage element of the at least one selected memory cell is completely set to a lower resistivity state; and
holding the at least one selected Y line in an isolated state until the carbon storage element of the at least one selected memory cell is completely set to the lower resistivity state.

10. The method of claim 9, wherein:
driving the selected X line to a X line select voltage, driving at least one selected Y line to the Y line select voltage, and isolating the at least one selected Y line cause an amount of charge to form on the at least one selected Y line; and
the amount of current available to completely set the carbon storage element of the at least one selected memory cell to the lower resistivity state is limited by the amount of the charge.

11. The method of claim 9, wherein isolating the at least one selected Y line of the plurality of Y lines comprises floating the at least one selected Y line.

12. The method of claim 11, wherein one of a plurality of MOSFETs is connected to each one of the plurality of Y lines, and floating the at least one selected Y line comprises turning off the MOSFET transistor associated with the at least one selected Y line.

13. The method of claim 12, wherein the MOSFET transistor is a NMOS transistor isolated in a p-type semiconductor well biased at a negative well voltage that is equal to or less than a voltage applied to a source or gate of the NMOS transistor.

14. The method of claim 9, wherein the at least one selected Y line of the plurality of Y lines is electrically connected to a data bus driven by a capacitive discharge circuit, and the data bus is isolated from a driving circuitry of the nonvolatile memory cell array.

15. The method of claim 9, further comprising:
driving the selected X line and the at least one selected Y line such that the diode steering element of the at least one selected memory cell is forward biased and the carbon storage element of the at least one selected memory cell is reset to a higher resistivity state.

16. The method of claim 9, wherein the diode steering element comprises a p-n semiconductor diode, a p-i-n semiconductor diode, or a punch-through diode.

17. The method of claim 9, wherein
each of the plurality of memory cells comprises a pillar shaped cell located between one of the plurality of X lines and one of the plurality of Y lines; and
the diode steering element is located over or under the carbon storage element.

18. The method of claim 1, further comprising:
sensing a temperature of at least one memory cell or a chip comprising the at least one memory cell, the at least one memory cell comprising the diode steering element and the carbon storage element;
selecting a setting voltage based on the sensed temperature; and
providing the first voltage comprising the setting voltage to the at least one memory cell, such that the steering element is reverse biased and the storage element is set to the lower resistivity state.

19. The method of claim 18, further comprising providing a resetting voltage to the at least one memory cell, such that the steering element is forward biased and the storage element is reset to a higher resistivity state.

20. The method of claim 18, wherein providing the setting voltage to the at least one memory cell comprises providing a voltage pulse to the at least one memory cell.

21. The method of claim 18, wherein:
the sensed temperature comprises a first temperature or a second temperature;
a first setting voltage is associated with the first temperature a second setting voltage is associated with the second temperature; and
when the second temperature is lower than the first temperature, a magnitude of the second voltage is greater than a magnitude of the first voltage.

22. The method of claim 18, wherein selecting the setting voltage based on the sensed temperature comprises increasing a magnitude of the setting voltage in a range of about 1 Volt to 2 Volts when the sensed temperature decreases, relatively, about 55 to 65 degrees Celsius.

23. The method of claim 18, wherein selecting the setting voltage based on the sensed temperature comprises calculating the setting voltage based on an algorithm which is a function the sensed temperature or matching the sensed temperature to a setting voltage value in a look-up table.

24. The method of claim 18, wherein the steering element comprises a p-n semiconductor diode, a p-i-n semiconductor diode, or a punch-through diode.

25. The method of claim 18, wherein:
the storage element and the steering element comprise a pillar shaped cell located over a lower electrode and under an upper electrode;
the steering element is located over or under the storage element; and
the storage element and the steering element are electrically connected in series.

26. A method of programming a nonvolatile memory cell comprising a diode steering element in series with a carbon storage element, the method comprising:
providing a first voltage to the nonvolatile memory cell, such that the diode steering element is reverse biased and the carbon storage element is set to a lower resistivity state,
wherein the carbon storage element comprises a graphene switchable resistance material.

* * * * *